US006299314B1

(12) United States Patent
Igarashi et al.

(10) Patent No.: US 6,299,314 B1
(45) Date of Patent: Oct. 9, 2001

(54) SEMICONDUCTOR DEVICE WITH ELECTRICAL ISOLATION MEANS

(75) Inventors: Motoshige Igarashi; Hiroyuki Amishiro; Keiichi Higashitani, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/494,785

(22) Filed: Jan. 31, 2000

(30) Foreign Application Priority Data

Aug. 2, 1999 (JP) .................................................. 11-218503

(51) Int. Cl.[7] .................................................... H01L 29/76
(52) U.S. Cl. .......................... 357/368; 357/93; 357/374; 357/446; 357/499; 357/503; 357/506
(58) Field of Search ............................. 257/93, 374, 446, 257/499, 503, 506, 368

(56) References Cited

U.S. PATENT DOCUMENTS 5,741,735 * 4/1998 Violette et al. ....................... 438/199
5,849,621 * 12/1998 Gardner et al. ...................... 438/279

FOREIGN PATENT DOCUMENTS 9-55440   2/1997 (JP).
10-4190   1/1998 (JP).

* cited by examiner

Primary Examiner—Fetsum Abraham
(74) Attorney, Agent, or Firm—Oblon, Spivak, McClelland, Maier & Neustadt, P.C.

(57) ABSTRACT

Provided are a semiconductor device in which a MOS transistor of SAC structure and a MOS transistor of silicide structure are are provided together, and a method of manufacturing the same. Each gate electrode (3) of gate structures (GT11 to GT13) is covered with an upper nitride film (4) and sidewall nitride film (5). Therefore, when an interlayer insulating film (10) being oxide film is selectively removed for forming contact holes (CH1 and CH2), the upper nitride film (4) and sidewall nitride film (5) are not removed, thereby preventing the gate electrode (3) from being exposed. Particularly, in the gate structures (GT11 and GT12), even when the contact hole (CH1) is dislocated to either side, no short-circuit is developed between a conductor layer (CL1) and the gate electrode (3). Thus, the gate structures (GT11 and GT12) can be disposed without being restricted by the alignment margin of the contact hole (CH1), and the distance between the gates can be reduced for attaining high integration.

20 Claims, 16 Drawing Sheets

SEMICONDUCTOR DEVICE WITH ELECTRICAL ISOLATION MEANS

BACKGROUND OF THE INVENTION

1. Field of the Invention

The present invention relates to a semiconductor device and method of manufacturing the same, and particularly, to a semiconductor device including a MOS transistor and method of manufacturing the same.

2. Description of the Background Art

The allowable value to alignment mismatch (alignment margin) of the constructions in manufacturing steps is decreased as semiconductor devices are miniaturized. This is an obstacle to high integration of semiconductor devices. In order to facilitate integration without being restricted by the alignment margin, it has been examined that the semiconductor elements constituting a semiconductor device are made to have such a structure as may not be subject to disadvantages in the event of an alignment mismatch.

For example, there is such a method of making a MOS transistor have a self align contact structure (hereinafter referred to as SAC structure) in a memory part where high integration is especially required in semiconductor devices.

FIG. 31 gives an one example of SAC structure. In FIG. 31, two gates GT are disposed a predetermined distance apart on a silicon substrate 101. The gates GT comprise a gate oxide film 102 disposed on the silicon substrate 101, a gate electrode 103 on the gate oxide film 102, an upper nitride film 104 on the gate electrode 103, and a sidewall nitride film 105 disposed such as to make contact with the side faces of the upper nitride film 104, gate electrode 103 and gate oxide film 102. A source/drain layer SD is disposed in the surface of the silicon substrate 101 lying on both sides of the gate GT.

An interlayer insulating film IZ formed from a silicon oxide film is disposed such as to cover the two gates GT, and a contact hole CH penetrating the interlayer insulating film IZ is disposed such as to reach the source/drain layer SD between the gates GT. A conductor layer CL is buried in the contact hole CH.

Since the gate electrode 103 is covered with the upper nitride film 104 and sidewall nitride film 105, it is possible to prevent the upper nitride film 104 and sidewall nitride film 105 from being removed in forming the contact hole CH. In the event of a contact hole dislocation, it is possible to prevent the gate electrode 103 from being exposed, and no short-circuit is developed between the conductor layer CL and gate electrode 103. Thereby, the contact hole CH can be formed without being restricted by the alignment margin. In this case, the opening size of the contact hole CH is determined in a self-aligned manner by the distance between the gates GT, and hence it can be called "self align contact."

Accordingly, the employment of the SAC structure allows it to be less subject to the restriction of alignment margin, and thus facilitates integration. Therefore, the SAC structure is useful with the memory part in which the distance between the two gates is progressively shorter. Unfortunately, the SAC structure is not applicable to the logic part.

Specifically, in the logic part, the resistance value is lowered for attaining high speed operation by silicide structure that a silicide layer is formed in a self-aligned manner on a gate electrode and on a source/drain layer of a MOS transistor. Whereas in the SAC structure, an upper nitride film is formed on a gate electrode, and it is impossible to form a silicide layer on the gate electrode, thus failing to form a MOS transistor of SAC structure in the logic part.

Conventionally, such a method of forming a silicide protection film comprised of a silicon oxide film has been employed in order to prevent that a silicide layer is formed on a gate electrode of a protection circuit for the protection of a main circuit from surge voltage, and on a source/drain layer in the vicinity of the gate electrode, thereby avoiding the current concentration due to irregularities of the crystal particles in the silicide layer.

FIG. 32 gives an example of formation of a silicide protection film. As shown in FIG. 32, gates GT1 and GT2 are disposed a predetermined distance apart on a silicon substrate SB.

The gate GT1 comprises a gate oxide film OX disposed on the silicon substrate SB, a gate electrode GE on the gate oxide film OX, and a sidewall oxide film SW disposed such as to make contact with the side faces of the gate electrode GE and gate oxide film OX.

The gate GT2 comprises a gate oxide film OX disposed on the silicon substrate SB, a gate electrode GE on the gate oxide film OX, a silicide layer SF on the gate electrode, and a sidewall oxide film SW disposed such as to make contact with the side faces of the gate electrode GE, silicide layer SF and gate oxide film OX.

A source/drain layer SD is formed in the surface of the silicon substrate SB lying on both sides of the gates GT1 and GT2, and a silicide layer SF is disposed on the source/drain layer SD.

Note that a silicide protection film SP is formed on the gate GT1 and on the surface of the source/drain layer SD lying in the vicinity of the gate GT1, and no silicide layer SF is disposed on the gate GT1 and on the surface of the source/drain layer SD in the vicinity of the gate GT1.

In this manner, it is avoidable that a silicide layer is formed on the gate GT1 and on the source/drain layer SD in the vicinity of the gate GT1, by virtue of the presence of silicide protection film SP. It is not impossible, therefore, that a MOS transistor of SAC structure and a MOS transistor of silicide structure are provided together. However, the manufacturing steps is complicated by selective formation of a silicide protection film SP, and restriction is imposed on the distance between the gates, because of the necessity of forming the silicide protection film SP. Consequently, hitherto no attempts have been made to construct so that a MOS transistor of SAC structure and a MOS transistor of silicide structure are provided together in both memory part and logic part. This is true for circuit parts other than the memory part and logic part.

To meet demanding requirements of high integration and high speed operation of semiconductor devices in recent years, the inventors recognized the necessity of a technique of providing together a MOS transistor of SAC structure and a MOS transistor of silicide structure when they attained such a technical thought of employing a MOS transistor of silicide structure in a memory part and a MOS transistor of SAC structure in a logic part.

SUMMARY OF THE INVENTION

According to a first aspect of the invention, a semiconductor device having a plurality of circuit parts that are of different constructions and disposed on a semiconductor substrate, each of the circuit parts comprises: at least one first and second gate structures disposed on at least either of the semiconductor substrate and an isolation insulating film disposed on the semiconductor substrate; an interlayer insulating film covering the first and second gate structures; and a plurality of contacts penetrating the interlayer insulating film and reaching at least either of the semiconductor substrate and the isolation insulating film, the at least one first gate structure comprising: a first gate oxide film; a first gate electrode disposed on the first gate oxide film; an upper insulating film disposed on the first gate electrode; and a first sidewall insulating film disposed on side faces of the upper insulating film, the first gate electrode and the first gate oxide film, and the at least one second gate structure comprising: a second gate oxide film; a second gate electrode disposed on the second gate oxide film; a silicide layer disposed on the second gate electrode; and a second sidewall insulating film disposed on side faces of the silicide layer, the second gate electrode and the second gate oxide film.

According to a second aspect of the present invention, the at least one first gate structure is a plurality of first gate structures; and the plurality of contacts have a self align contact with which the opening size of the contact hole is determined in a self aligned manner by the distance between the plurality of first gate structures, the self align contact having a contact hole penetrating the interlayer insulating film and reaching the semiconductor substrate, and being disposed between the plurality of first gate structures in parallel arrangement.

According to a third aspect of the present invention, the plurality of contacts are provided with a shared contact having a contact hole penetrating the interlayer insulating film and reaching the semiconductor substrate and the silicide layer of the at least one second gate structure, the contact hole being disposed between the at least one first and second gate structures in parallel arrangement.

According to a fourth aspect of the present invention, the at least one second gate structure is a plurality of second gate structures; and the plurality of contacts are provided with a shared contact having a contact hole disposed between the plurality of second gate structures in parallel arrangement, the contact hole penetrating the interlayer insulating film, and reaching the semiconductor substrate and the silicide layer of at least either of the plurality of second gate structures.

According to a fifth aspect of the present invention, the at least one second gate structure for engagement with the contact hole is disposed on the isolation insulating film.

According to a sixth aspect of the present invention, the at least one first and second gate structures are provided together on the semiconductor substrate, having sandwiched therebetween the isolation insulating film; the semiconductor substrate surfaces on both sides of the at least one first and second gate structures have a source/drain layer; and the plurality of contacts are provided with a shared contact having a contact hole disposed between the at least one first and second gate structures, the contact hole penetrating the interlayer insulating film, reaching the source/drain layers having sandwiched therebetween the isolation insulating film, and the isolation insulating film, and reaching the silicide layer of the at least one second gate structure.

According to a seventh aspect of the present invention, a central gate structure that corresponds to the at least one first gate structure and is disposed such as to locate at a relatively center; and first side and second side gate structures that correspond to either of the at least one first and second gate structures, and are disposed on both sides of the central gate structure, and characterized in that the plurality of contacts have a contact hole disposed between the first and second side gate structures such as to expose the central gate structure, the contact hole penetrating the interlayer insulating film and reaching at least either of the semiconductor substrate and the isolation insulating film, and have a conductor layer being buried in the contact hole and covering the central gate structure.

According to an eighth aspect of the present invention, the central gate structure and the first and second side gate structures are disposed on the isolation insulating film; the first and second side gate structures correspond to the at least one second gate structure; and the contact hole is disposed such as to reach the silicide layer of the first and second side gate structures.

According to a ninth aspect of the present invention, the central gate structure is disposed on the isolation insulating film; the first and second side gate structures are disposed on the semiconductor substrate, having sandwiched therebetween the isolation insulating film; the semiconductor substrate surfaces on both sides of the first and second side gate structure have a source/drain layer, respectively; and the contact hole is disposed such as to reach the source/drain layers having sandwiched therebetween the isolation insulating film of the first and second side gate structures.

According to a tenth aspect of the present invention, the central gate structure and the first side gate structure are disposed on the isolation insulating film, and the first side gate structure corresponds to the at least one second gate structure; the second side gate structure is disposed on the semiconductor substrate; the semiconductor substrate surfaces on both sides of the second side gate structure have a source/drain layer; and the contact hole is disposed such as to reach the source/drain layer on the isolation insulting layer side of the second side gate structure and reach the silicide layer of the first side gate structure.

According to an eleventh aspect of the present invention, the central gate structure is disposed on the isolation insulating film; the first and second side gate structures are disposed on the semiconductor substrate, having sandwiched therebetween the isolation insulating film; the semiconductor substrate surfaces on both sides of the first and second side gate structures have a source/drain layer, respectively; the first and second side gate structures correspond to the at least one second gate structure; and the contact hole is disposed such as to reach the source, drain layers having sandwiched therebetween the isolation insulating film of the first and second side gate structures, and also reach the silicide layers of the first and second side gate structures.

According to a twelfth aspect of the present invention, the at least one second gate structure is a plurality of second gate structures; the semiconductor substrate surfaces on both sides of the plurality of first gate structures have a source/drain layer; the plurality of first gate structures are disposed in a region in the vicinity of the self align contact; and the plurality of second gate structures are continuous with the plurality of first gate structures on other regions than the region in the vicinity of the self align contact.

According to a thirteenth aspect of the present invention, the gate electrode of the plurality of first gate structures has an impurity of the same conductivity type as that of the source/drain layer.

According to a fourteenth aspect of the present invention, the semiconductor substrate surfaces on both sides of the plurality of first gate structures have a source/drain layer, respectively; and a plane array pattern of the contact hole is set such that the source/drain layers adjacent each other are of different patterns.

According to a fifteenth aspect of the present invention, the semiconductor device further comprises a silicide layer on an upper part of the source/drain layer.

According to a sixteenth aspect of the present invention, a method of manufacturing a semiconductor device which has a plurality of circuit parts that are of different constructions and disposed on a semiconductor substrate, each of the circuit parts having first and second gate structures which are disposed on at least either of the semiconductor substrate and an isolation insulating film on the semiconductor substrate, comprises the steps of: (a) forming an oxide film on the semiconductor substrate; (b) forming a gate electrode layer on the oxide film; (c) selectively forming a nitride film on the gate electrode layer such as to correspond to the location of the first gate structure; (d) selectively forming a mask made of oxide film on the nitride film and on the gate electrode layer such as to correspond to the location of the second gate structure; (e) by using the mask, etching away the nitride film and the gate electrode layer, and selectively removing the mask and the oxide film, so that a first gate oxide film, a first gate electrode on the first gate oxide film and an upper nitride film on the first gate electrode are formed such as to correspond to the location of the first gate structure, and that a second gate oxide film and a second gate electrode on the second gate oxide film are formed such as to correspond to the location of the second gate structure; (f) forming a first sidewall nitride film on side faces of the upper nitride film, the first gate electrode and the first gate oxide film, to form the first gate structure, and forming a second sidewall nitride film on side faces of the second gate electrode and the second gate oxide film; and (g) forming a silicide layer on an upper part of the second gate electrode, to form the second gate structure.

According to a seventeenth aspect of the present invention, the method of manufacturing a semiconductor device further comprises the step, prior to the step (g), of forming a source/drain layer in the surface of the semiconductor substrate, and characterized in that the step (g) includes a silicide step of forming a silicide layer on the source/drain layer at the same time.

With the first aspect, in a semiconductor device having a plurality of circuit parts of different constructions, such as a memory part (e.g., SRAM) and a logic part, high integration and high speed operation are attainable by providing together the self align contact structure based on the first gate structure and the silicide structure based on the second gate structure, in the memory part. In addition, high integration is also attainable while maintaining high speed operation, by disposing the mentioned self align contact and silicide structure in the logic part.

With the second aspect, the self align contact structure is obtainable based on the first gate structures in parallel arrangement, and the distance between the gates can be reduced for achieving high integration.

With the third aspect, a shared contact can be constructed based on the second gate structure, thereby simplifying the construction for the connection between the silicide layer of the second gate structure, i.e., the gate electrode, and the semiconductor substrate, i.e., the active region.

With the fourth aspect, a shared contact can be constructed based on either of the second gate structures in parallel arrangement, thereby simplifying the construction for the connection between the silicide layer of the second gate structure, i.e., the gate electrode, and the semiconductor substrate, i.e., the active region.

With the fifth aspect, the resistance of the second gate structure can be lowered by disposing a silicide layer in the second gate structure lying on the isolation insulating layer serving as a gate wiring.

With the sixth aspect, it is possible to simplify the construction for electrically connecting the electrically isolated source/drain layers having sandwiched therebetween the isolation insulating film, to the silicide layer, i.e., the gate electrode, of the second gate structure.

With the seventh aspect, although the conductor layer covers the central gate structure, the gate electrode of the first gate structure is covered with the insulating film, and thus it can exist electrically independently of the first and second side gate structures. This increases the degree of freedom of layout, leading to high integration.

With the eighth aspect, even when wirings desired to be electrically isolated from each other are present between wirings desired to be electrically connected with each other, a connection between the latter wirings can be made easily by covering the former wirings with an insulating film and disposing a conductor layer such as to cover the insulating film. This structure realizes simplification of manufacturing steps and increase in the degree of freedom of layout, leading to high integration. Whereas in the conventional construction, a single contact is provided on wirings desired to be electrically connected with each other, and a connection between the contacts is made through a wiring layer disposed on an interlayer insulating film. As a result, the manufacturing steps is complicated, and there are many limitations upon layout.

With the ninth aspect, even when wirings desired to be electrically isolated from each other are present between source/drain layers desired to be electrically connected with each other, which layers having sandwiched therebetween an isolation insulating film, a connection between the source/drain layers can be made easily by covering the wirings (desired to be electrically isolated) with an insulating film and disposing a conductor layer such as to cover the insulating film. This simplifies manufacturing steps and increases the degree of freedom of layout, leading to high integration. Whereas in the conventional construction, a single contact is provided on source/drain layers desired to be electrically connected with each other, and a connection between the contacts is made through a wiring layer disposed on an interlayer insulating film. As a result, the manufacturing steps is complicated, and there are many limitations upon layout.

With the tenth aspect, even when wirings desired to be electrically isolated from each other are present between a wiring and source/drain layer which are desired to be electrically connected with each other, a connection between the latter wiring and source/drain layer can be made easily by covering the former wirings (desired to be electrically isolated) with an insulating film and disposing a conductor layer such as to cover the insulating film. This simplifies manufacturing steps and increases the degree of freedom of layout, leading to high integration. Whereas in the conventional construction, a single contact is provided on a wiring and source/drain layer which are desired to be electrically connected with each other, and a connection between the contacts is made through a wiring layer disposed on an interlayer insulating film. As a result, the manufacturing steps is complicated, and there are many limitations upon layout.

With the eleventh aspect, even when wirings desired to be electrically isolated from each other are present between two MOS transistors for which it is desired to electrically connect between their respective source/drain layers and between their respective gate electrodes, a connection between the source/drain layers and a connection between the gate electrodes can be made easily by covering the wirings (desired to be electrically isolated) with an insulating film and disposing a conductor layer such as to cover the insulating film. This simplifies manufacturing steps and increases the degree of freedom of layout, leading to high integration. Whereas in the conventional construction, a single contact is provided on a wiring and source/drain layer which are desired to be electrically connected with each other, and a connection between the contacts is made through a wiring layer disposed on an interlayer insulating film. As a result, the manufacturing steps is complicated, and there are many limitations upon layout.

With the twelfth aspect, a low-resistance of the gate electrode is achievable, and high integration is attainable while maintaining high speed operation, by limiting the location of the self align contact structure formed from the first gate structures in parallel arrangement, only in the vicinity of the self align contact, and disposing the second gate structure, i.e., the gate having the silicide layer, such as to be continuous with the first gate structures in parallel arrangement, in other regions than the region in the vicinity of the self align contact.

With the thirteenth aspect, when the first gate structure is a dual polysilicon gate, even in the construction of connecting MOS transistors of different conductive types, it is possible to prevent a parasitic diode from being formed in the junction between two gates into which impurities of different conductivity types have been implanted, by disposing the second gate structure, i.e., the gate having the silicide layer, such as to be continuous with the first gate structures in parallel arrangement, in other regions than the region in the vicinity of the self align contact.

With the fourteenth aspect, by setting a plane array pattern of contact holes when employing the self align contact structure, such that the source/drain layers adjacent each other are of different patterns, the localization of the contact holes is lowered to lessen the possibility of disadvantages in pattern resolution due to proximity effect and the like, when a resist patterning is performed by using photolithography technique in the formation of contact holes. This permits a further reduction in the distance between the gates.

With the fifteenth aspect, the contact resistance between the source/drain layer and contact part can be lowered by overlaying a silicide layer on the source/drain layer.

With the sixteenth aspect, a gate where no silicide layer will be formed can be selectively formed on a desired location in a relatively easy step, by previously and selectively forming a nitride film that serves as an upper nitride film for the prevention of any silicide layer formation, on a gate electrode layer, and then forming a mask made of an oxide film on the nitride film.

With the seventeenth aspect, a silicide layer can be also formed on the source/drain layer at the same time, making it easy to obtain the construction with a low contact resistance between the source/drain layer and contact part.

An object of the present invention is to provide a semiconductor device in which a MOS transistor of SAC structure and a MOS transistor of silicide structure are provided together, and a method of manufacturing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Preferred Embodiment

A-1. Device Construction

Figure 1:
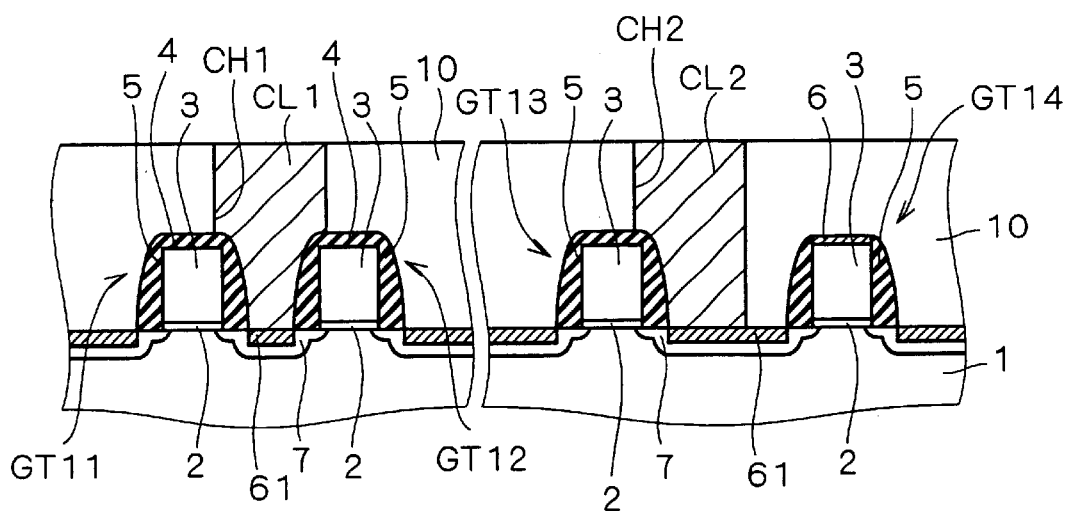
FIG. 1 is a diagram illustrating the construction of a semiconductor device according to a first preferred embodiment of the invention.

FIG. 1 is a cross section illustrating the construction of a semiconductor device according to a first preferred embodiment. As shown in FIG. 1, gate structures GT11, GT12, and gate structures GT13, GT14 are disposed a predetermined distance apart on a silicon substrate 1, respectively.

The gate structures GT11 to GT13 comprise a gate oxide film 2 disposed on the silicon substrate 1, a gate electrode 3 which is formed from polysilicon and disposed on the gate oxide film 2, an upper nitride film 4 on the gate electrode 3, and a sidewall nitride film 5 disposed such as to make contact with the side faces of the upper nitride film 4, gate electrode 3 and gate oxide film 2.

The gate structure GT14 comprises a gate oxide film 2 disposed on the silicon substrate 1, a gate electrode 3 which is formed from polysilicon and disposed on the gate oxide film 2, a silicide layer 6 which is formed from, for example, cobalt silicide ($CoSi_2$) and disposed on the gate electrode 3, and a sidewall nitride film 5 disposed such as to make contact with the side faces of the silicide layer 6, gate electrode 3 and gate oxide film 2.

A source/drain layer 7 is disposed in the surface of the silicon substrate 1 lying on both sides of the gate structures GT11 to GT14, and tale gate structures GT11 to GT14 function as the gate forming a MOS transistor. A silicide layer 61 formed from, for example, cobalt silicide is disposed on the source/drain layer 7.

An interlayer insulating film 10 formed from of a silicon oxide film is disposed such as to cover the gate structures GT11 to GT14. A contact hole CH1 penetrating the interlayer insulating film 10 is disposed such as to reach the source/drain layer 7 between the gate structures GT11 and GT12, and a contact hole CH2 penetrating the interlayer insulating film 10 is disposed such as to reach the source/drain layer 7 between the gate structures GT13 and GT14.

Conductor layers CL1 and CL2 which are formed from, for example, tungsten (W) are buried in the contact holes CH1 and CH2, respectively.

Each gate electrode 3 of the gate structures GT11 to GT13 is covered with the upper nitride film 4 and sidewall nitride film 5. Therefore, when the interlayer insulating film 10 being oxide film is selectively removed for forming the contact holes CH1 and CH2, the upper nitride film 4 and sidewall nitride film 5 are not removed, thereby preventing the gate electrode 3 from being exposed. Particularly, in the gate structures GT11 and GT12, even if the contact hole CH1 is dislocated to either side, no short-circuit is developed between the conductor layer CL1 and gate electrode 3. Therefore, the gate structures GT11 and GT12 can be provided together, without being restricted by the alignment margin of the contact hole CH1, and the distance between the gates can be reduced for attaining high integration. To reduce the distance between the gates means to reduce the area of the source/drain layer, which lowers junction capacitance for achieving high speed operation.

The opening size of the contact hole CH1 is determined in a self-aligned manner by the distance between the gate structures GT11 and GT12. Hence, a contact formed by the contact hole CH1 and the conductive layer CL1 can be called "self align contact," and the gate structures GT11 and GT12 can be called "self align contact structure (SAC structure)" that is not subject to disadvantages even when an alignment mismatch occurs.

On the other hand, a silicide layer 6 is disposed on the upper part of the gate electrode 3 of the gate structure GT14, and a silicide layer 61 is disposed on the surface of the source/drain layer 7 lying on both sides of the gate structure GT14, resulting in the silicide structure. This enables to lower the resistance of the gate structure GT14 and to lower the contact resistance between the source/drain layer 7 and conductor layer CL2, thus leading to a MOS transistor capable of performing high speed operation. Note that a silicide layer 61 is also disposed on the surface of the source/drain layer 7 lying on both sides of the gate structures GT11 and GT12, thereby towering the contact resistance between the conductor layer CL2 and source/drain layer 7.

Since the silicide layer 6 is present on the upper part of the gate electrode 3 of the gate structure GT14, upon engagement of the contact hole CH2 with the silicide layer 6, short-circuit will be developed between the conductor layer CL2 and gate electrode 3, resulting in operational disadvantages. Therefore, the distance between the gate structures GT13 and GT14 is set in consideration of the alignment margin of the contact hole CH2, and the location of the contact hole CH2 is set such as to be closer to the gate structure GT13.

A-2. Manufacturing Method

Referring now to FIGS. 2 to 5 illustrating a sequence of manufacturing steps, description will be made of a method of manufacturing a semiconductor device in which a SAC structure and silicide structure are provided together.

Figure 2:
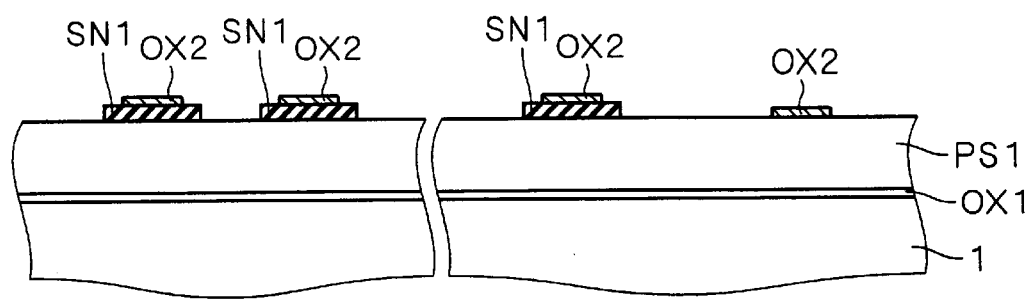
FIGS. 2 to 5 are diagrams illustrating a sequence of manufacturing steps of the semiconductor device of the first preferred embodiment.

In the step shown in FIG. 2, an oxide film OX1 is firstly formed on a silicon substrate 1, and a polysilicon layer PS1 is formed on the oxide film OX1. After a nitride film SN1 is selectively formed on the polysilicon layer PS1 by photolithography, a TEOS (tetra ethyl orthosilicate) oxide film OX2, for example, is selectively formed on the nitride film SN1 and on the polysilicon layer PS1 by photolithography. Here, the nitride film SN1 should be formed such as to be slightly larger than the TEOS oxide film OX2, in consideration of the alignment of the TEOS oxide film OX2.

The location of the nitride film SN1 corresponds to that of the gate structures GT11 to GT13 shown in FIG. 1, and the location of the TEOS oxide film OX2 making a direct contact with the polysilicon layer PS1 corresponds to that of the gate structure GT14.

Figure 3:
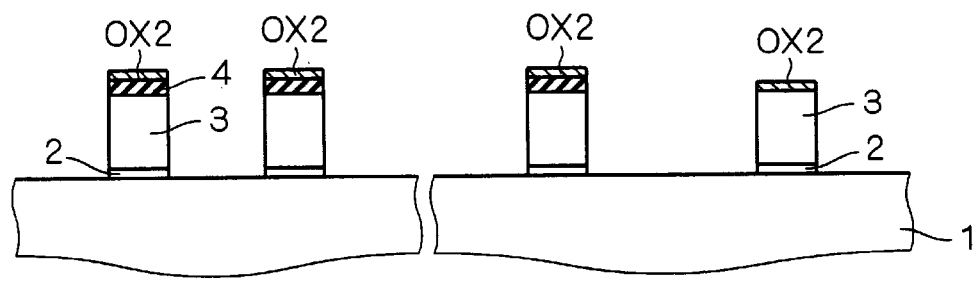
Figure 4:
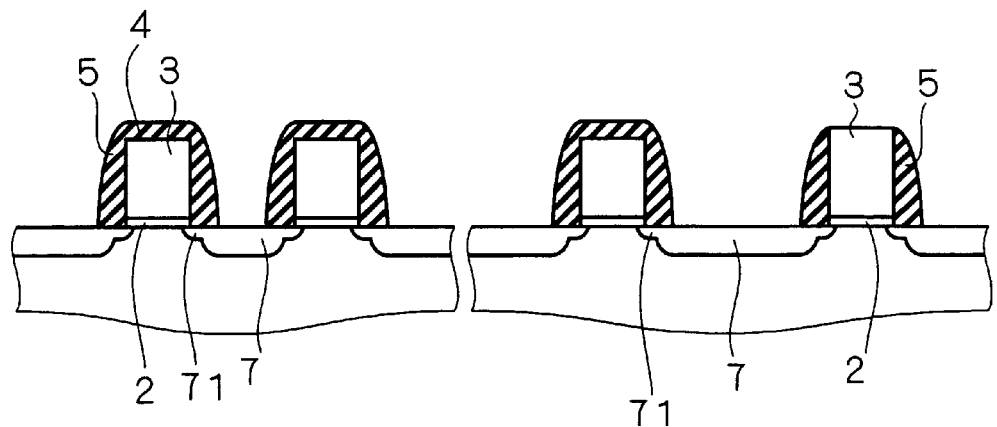

In the step shown in FIG. 3, by using the TEOS oxide film OX2 as a mask, the nitride film SN1 and polysilicon layer PS1 are etched away to expose the oxide film OX1. Then, the TEOS oxide film OX2 and oxide film OX1 are removed by etching, to form an upper nitride film 4, gate electrode 3 and gate oxide film 2.

By using the gate electrode 3 as a mask, impurity ions are implanted into the silicon substrate 1 to form a lightly doped drain layer 71.

After a nitride film is formed entirely, a sidewall nitride film 5 is formed by anisotropic etching. At this time, the etching is performed so that the surface of the gate electrode 3 having no upper nitride film 4 is exposed and the upper nitride film 4 is left. Then, by using the sidewall nitride film 5, upper nitride film 4, and gate electrode 3 as masks, impurity ions are implanted into the silicon substrate 1 to form a source/drain layer 7, resulting in the structure shown in FIG. 4. Alternatively, the silicon substrate 1 may be prevented from etching in such a manner that a lightly doped drain layer 71 is formed and, prior to the formation of a nitride film, an oxide film may be formed entirely, followed by forming a nitride film thereon, and the oxide film is used as an etching stopper, in forming a sidewall nitride film 5.

Figure 5:
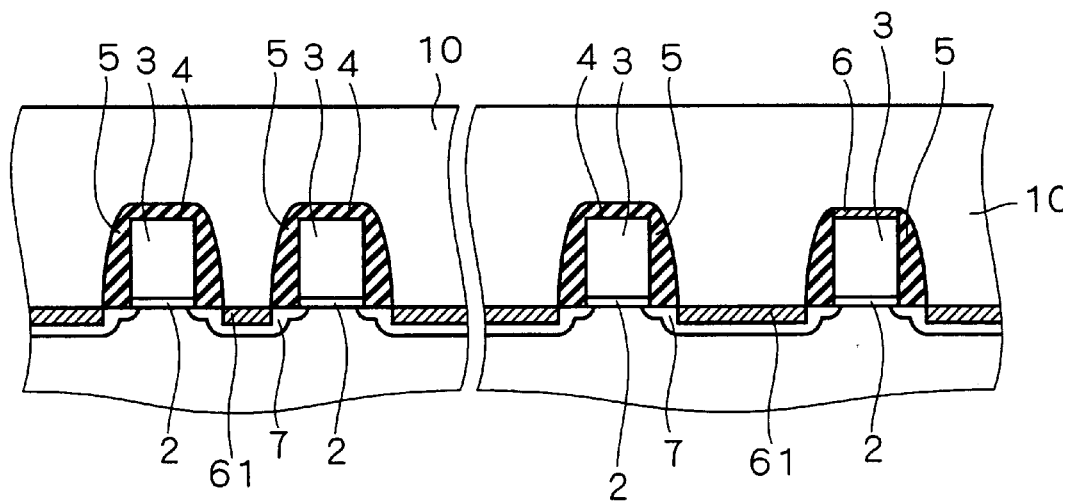

In the step shown in FIG. 5, after cobalt (Co) layer is formed entirely, by RTA (rapid thermal annealing) treatment using a ramp heating furnace, a cobalt silicide is formed on the surface of the silicon substrate 1 and on the polysilicon surface, and the unreacted cobalt layer is removed to form silicide layers 6 and 61 on the gate electrode 3 and on the source/drain layer 7, resulting in gate structures GT11 to GT14. Thereafter, an oxide film is formed such as to cover the gate structures GT11 to GT14, followed by planarization, to form an interlayer insulating film 10.

Subsequently, a contact hole CH1 penetrating the interlayer insulating film 10 is formed such as to reach the source/drain layer 7 between the gate structures GT11 and GT12, and a contact hole CH2 penetrating the interlayer insulating film 10 is formed such as to reach the source/drain layer 7 between the gate structures GT13 and GT14. Conductor layers CL1 and CL2 formed from tungsten are then buried in the contact holes CH1 and CH2, respectively, resulting in the structure shown in FIG. 1.

A-3. Effects

According to the semiconductor device of the first preferred embodiment in the foregoing, in a semiconductor device including a memory part such as a static RAM (SRAM), and a logic part, high integration and high speed operation are attainable by disposing the mentioned SAC structure and silicide structure together in the memory part. In addition, high integration is also attainable while maintaining high speed operation, by providing the mentioned SAC structure and silicide structure together in the logic part. The application of the present invention is not limited to the memory part and logic part, and the invention is useful for semiconductor devices for which high integration and high speed operation are required.

The feature of the manufacturing steps is, as described by referring to FIG. 2, that the gate on which no silicide layer is formed can be formed selectively at a desired position in a relatively easy step in such a manner that a nitride film SN1 serving as the upper nitride film 4 that protects formation of a silicide layer is previously and selectively formed on a polysilicon layer PS1, and a TEOS oxide film OX2 serving as the etching mask of the polysilicon layer PS1 is formed on the nitride film SN1.

The construction of employing a gate in which a gate electrode is covered with a nitride film and no silicide layer is disposed, and a gate having a silicide layer, is not limited to that shown in FIG. 1. Various modifications of the first preferred embodiment will be described as below.

A-4. First Modification

The SAC structure of FIG. 1 is an example of construction that the gate structures GT11 and GT12 are both disposed on the silicon substrate 1, and both form the MOS transistors. Alternatively, one of these can also have the construction for functioning as a gate wiring, as shown in FIG. 6.

Figure 6:
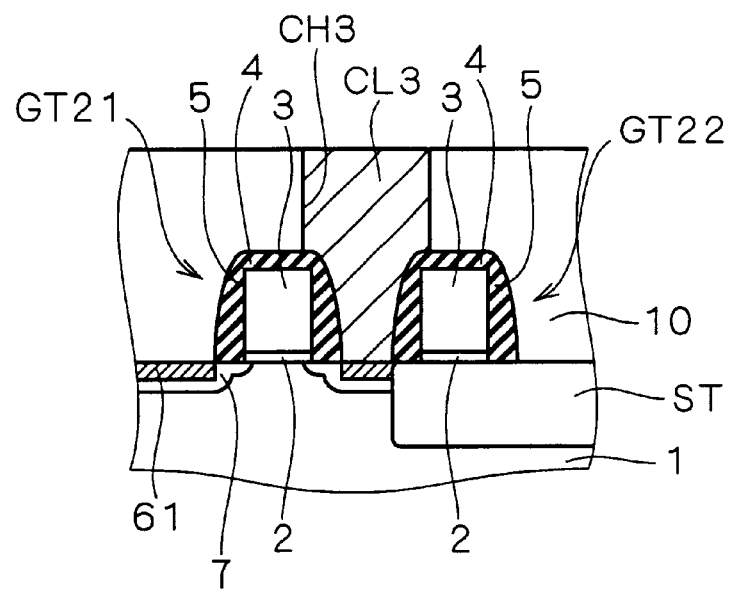
FIG. 6 is a diagram illustrating the construction of a first modification of the semiconductor device of the first preferred embodiment.

Referring to FIG. 6, a STI (shallow trench isolation) film ST is disposed in the surface of a silicon substrate 1. Gate structures GT21 and GT22 are disposed, a predetermined distance apart, on the silicon substrate 1 and the STI film ST, respectively. The STI film ST is one kind of trench isolation films and has the construction that an insulating film (generally, oxide film) is buried in a shallower trench, in view of miniaturization.

The gate structures GT21 and GT22 comprise a gate oxide film 2, a gate electrode 3 which is formed from polysilicon and disposed on the gate oxide film 2, an upper nitride film 4 on the gate electrode 3, and a sidewall nitride film 5 disposed such as to make contact with the side faces of the upper nitride film 4, gate electrode 3 and gate oxide film 2.

A source/drain layer 7 is disposed in the surface of the silicon substrate 1 lying on both sides of the gate structure GT21, and a silicide layer 61 formed from cobalt silicide is disposed on the surface of the source/drain layer 7.

An interlayer insulating film 10 formed from a silicon oxide film is disposed such as to cover the gate structures GT21 and GT22. A contact hole CH3 penetrating the interlayer insulating film 10 is disposed such as to reach the source/drain layer 7 between the gate structures GT21 and GT22. A conductor layer CL3 formed from, for example, tungsten is buried in the contact hole CH3.

The opening size of the contact hole CH3 is determined in a self-aligned manner by the distance between the gate structures GT21 and GT22, and the gate structures GT21 and GT22 can be disposed without being restricted by the alignment margin of the contact hole CH3. Therefore, the distance between the gates can be reduced for attaining high integration. To reduce the distance between the gates means to reduce the area of the source/drain layer, which lowers junction capacitance for achieving high speed operation.

A silicide layer 6 to be disposed on the surface of the source/drain layer 7 lying on both sides of the gate structure GT21 is formed in t:he step of forming the silicide structure to be formed in the non-illustrated part, thereby lowering the contact resistance between the conductor layer CL3 and the source/drain layer 7.

Thus, even in the gate wiring on the STI film ST, the SAC structure can be constructed by letting the gate electrode be covered with the nitride film. Accordingly, a wider range of application is attainable by using it in combination with the SAC structure and silicide structure as shown in FIG. 1.

A-5. Second Modification

Figure 7:
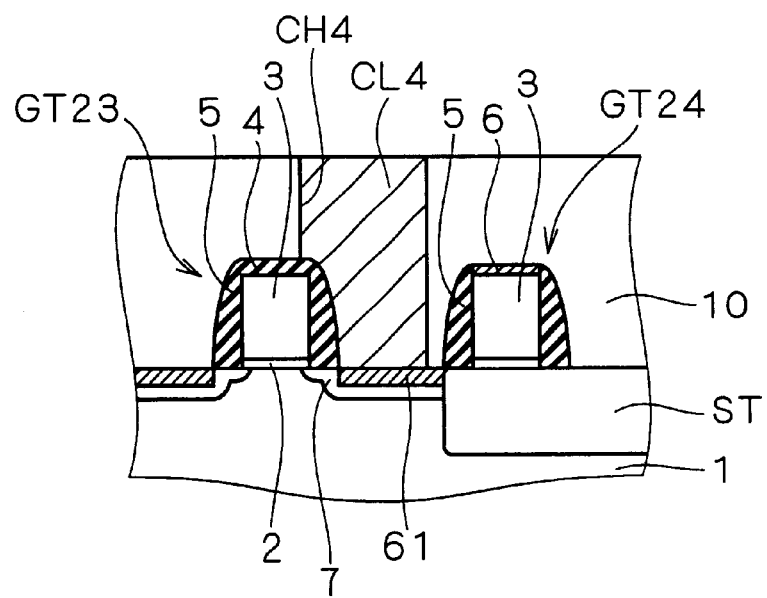
FIG. 7 is a diagram illustrating the construction of a second modification of the semiconductor device of the first preferred embodiment.

Although in the construction shown in FIG. 1, the gate structure GT14 of silicide structure is disposed on the silicon substrate 1 to form the MOS transistor, this construction can be used in combination with the construction for functioning as a gate wiring, as shown in FIG. 7.

Referring to FIG. 7, gate structures GT23 and GT24 are disposed, a predetermined distance apart, on a silicon substrate 1 and STI film ST, respectively.

The gate structure GT23 comprises a gate oxide film 2 on the silicon substrate 1, a gate electrode 3 which is formed from polysilicon and disposed on the gate oxide film 2, an upper nitride film 4 on the gate electrode 3, and a sidewall nitride film 5 disposed such as to make contact with the side faces of the upper nitride film 4, gate electrode 3 and gate oxide film 2.

The gate structure GT24 comprises a gate oxide film 2 on the STI film ST, gate electrode 3 which is formed from polysilicon and disposed on the gate oxide film 2, a silicide layer 6 which is formed from cobalt silicide and disposed on the gate electrode 3, and a sidewall nitride film 5 disposed such as to make contact with the side faces of the silicide layer 6, gate electrode 3 and gate oxide film 2.

A source/drain layer 7 is disposed in the surface of the silicon substrate 1 lying on both sides of the gate structure GT23, and a silicide layer 61 formed from cobalt silicide is disposed on the sur face of the source/drain layer 7.

An interlayer insulating film 10 formed from a silicon oxide film is disposed such as to cover the gate structures GT23 and GT24. A contact hole CH4 penetrating the interlayer insulating film 10 is disposed such as to reach the source/drain layer 7 between the gate structures GT23 and GT24. A conductor layer CL4 formed from, for example, tungsten is buried in the contact hole CH4.

Thus, even in the gate wiring on the STI film ST, the resistance of the gate structure GT24 can be lowered by disposing the silicide layer 6 on the gate electrode 3. In addition, the contact resistance between the conductor layer CL4 and source/drain layer 7 can be lowered by disposing the silicide layer 61 on the surface of the source/drain layer 7 on both sides of the gate structure GT23. Accordingly, a wider range of application is attainable by using it in combination with the SAC structure and silicide structure as shown in FIG. 1.

Since the silicide layer 6 is disposed on the upper part of the gate electrode 3 of the gate structure GT24, upon engagement of the contact hole CH4 with the silicide layer 6, short-circuit will be developed between the conductor layer CL and gate electrode 3, resulting in operational disadvantages. Therefore, the distance between the gate structures GT23 and GT24 is set in consideration of the alignment margin of the contact hole CH4, and the location of the contact hole CH4 is set such as to be closer to the gate structure GT23.

A-6. Third Modification

In the gate structure GT14 of silicide structure shown in FIG. 1, layout is set such that the contact hole CH2 does not engage the silicide layer 6, and no short-circuit is developed between the conductor layer CL2 and gate electrode 3. Alternatively, the gate electrode 3 is brought into be electrically connected to the source/drain layer 7, as shown in FIG. 8.

Figure 8:
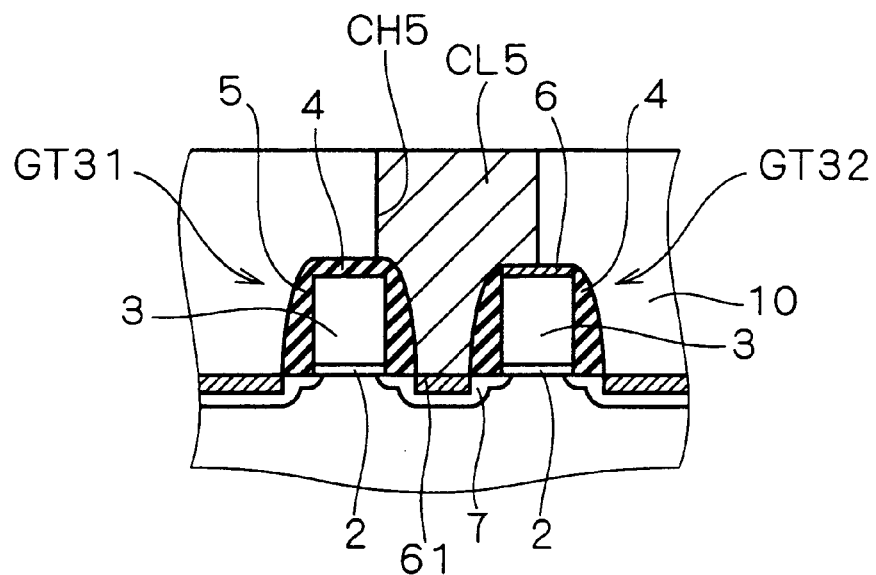
FIG. 8 is a diagram illustrating the construction of a third modification of the semiconductor device of the first preferred embodiment.

Referring to FIG. 8, gate structures GT31. and GT32 are disposed a predetermined distance apart on a silicon substrate 1.

The gate structure GT31 comprises a gate oxide film 2 on the silicon substrate 1, a gate electrode 3 which is formed from polysilicon and disposed on the gate oxide film 2, an upper nitride film 4 on the gate electrode 3, and a sidewall nitride film 5 disposed such as to make contact with the side faces of the upper nitride film 4, gate electrode 3 and gate oxide film 2.

The gate structure GT32 comprises a gate oxide film 2 on the silicon substrate 1, a gate electrode 3 which is formed from polysilicon and disposed on the gate oxide film 2, a silicide layer 6 which is formed from cobalt silicide and disposed on the gate electrode 3, and a sidewall nitride film 5 disposed such as to make contact with the side faces of the silicide layer 6, gate electrode 3 and gate oxide film 2.

A source/drain layer 7 is disposed in the surface of the silicon substrate 1 lying on both sides of the gate structures GT31 and GT32, and a silicide layer 61 formed from cobalt silicide is disposed on the surface of the source/drain layer 7.

An interlayer insulating film 10 formed from a silicon oxide film is disposed such as to cover th e gate structures GT31 and GT32. A contact hole C5 penetrating the interlayer insulating film 10 is disposed such as to reach the source/drain layer 7 between the gate structures GT31 and GT32. A conductor layer CL5 formed from, for example, tungsten is buried in the contact hole CH5.

In this construction, the contact hole CH5 is disposed such as to engage the silicide layer 6 of the gate structure GT32, so that the conductor layer CL5 provides an electrical connection between the silicide layer 6 (namely, the gate electrode 3) and the silicide layer 61 (namely, the source/drain layer 7).

Hereinafter, a contact connecting a plurality of patterns at the same time, such as the contact formed by the contact hole CH5 and conductor layer CL5, is referred to as "shared contact." By electrically connecting the gate electrode 3 and source/drain layer 7, it is possible to obtain the construction of diode connection with which the OS transistor formed by the gate structure GT32 and source/drain layer 7 is brought into be always in on state or off state.

Thus, thanks to the g ate structure GT14 of silicide structure, the gate electrode 3 and source/drain layer 7 can be connected electrically by the shared contact, which simplifies the step for the connection therebetween.

In this case, the opening size of the contact hole CH5 is determined in a self-aligned manner by the distance between the gates structures GT31 and GT32. Therefore, the gate structures GT31 and GT32 can be disposed without being restricted by the alignment margin of the contact hole CH5, and the distance between the gates can be reduced for attaining high integration. To reduce the distance between the two gates means to reduce the area of the source/drain layer, which lowers junction capacitance for achieving high speed operation.

It is, of course, possible to widen the range of application by using in combination with the SAC structure and salicide structure as shown in FIG. 1.

A-7. Fourth Modification

In the gate structure GT31 of the third modification as shown in FIG. 8, the gate electrode 3 is covered with the nitride film and has no silicide layer. The gate structure can be provided with a silicide layer as shown in FIG. 9.

Figure 9:
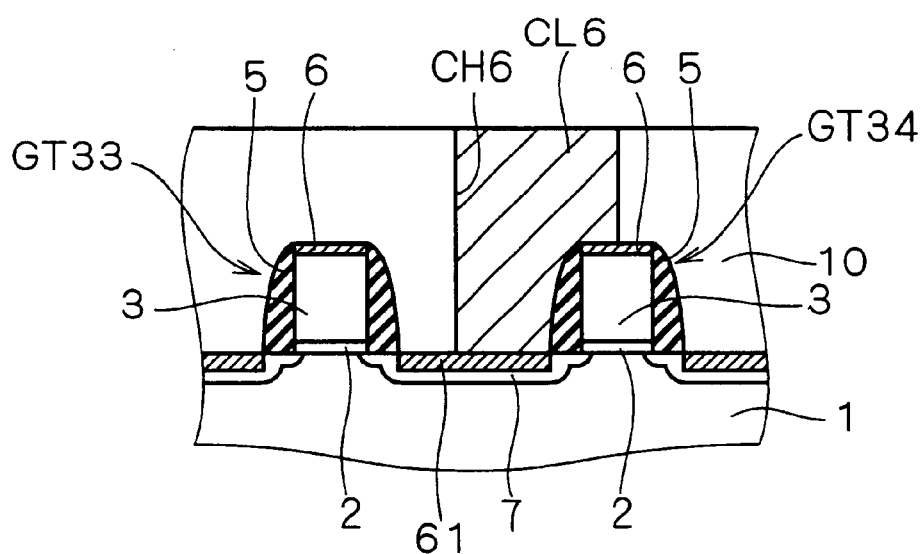
FIG. 9 is a diagram illustrating the construction of a fourth modification of the semiconductor device of the first preferred embodiment.

Referring to FIG. 9, gate structures GT33 and GT34 are disposed a predetermined distance apart on a silicon substrate 1.

The gate structures GT33 and GT34 comprise a gate oxide film 2 on the silicon substrate 1, a gate electrode 3 which is formed from polysilicon and disposed on the gate oxide film 2, a silicide layer 6 on the gate electrode 3, and a sidewall nitride film 5 disposed such as to make contact with the side faces of the silicide layer 6, gate electrode 3 and gate oxide film 2.

A source/drain layer 7 is disposed in the surface of the silicon substrate 1 lying on both sides of the gate structures GT33 and GT34, and a silicide layer 61 formed from cobalt silicide is disposed on the surface of the source/drain layer 7.

An interlayer insulating film 10 formed from a silicon oxide film is disposed such as to cover the gate structures GT33 and GT34. A contact hole CH6 penetrating the interlayer insulating film 10 is disposed such as to reach the source/drain layer 7 between the gate structures GT33 and GT34. A conductor layer CL6 formed from, for example, tungsten is buried in the contact hole CH6.

The contact hole CH6 is disposed such as to engage the silicide layer 6 of the gate structure GT34, and the conductor layer CL6 functions as the shared contact that provides an electrical connection between the silicide layer 6 (namely, the gate electrode 3) and the silicide layer 61 (namely, the source/drain layer 7).

Thus, thanks to the gate structure GT14 of salicide structure, the gate electrode 3 and source/drain layer 7 can be connected electrically by the shared contact, which simplifies the step for the connection therebetween.

It is, of course, possible to widen the range of application by using in combination with the SAC structure and salicide structure as shown in FIG. 1.

Since the salicide layer 6 is also present on the upper part of the gate electrode 3 of the gate structure GT33, upon engagement of the contact hole CH6 with the silicide layer 6, short-circuit will be developed between the conductor layer CL6 and gate electrode 3, resulting in operational disadvantages. Therefore, the distance between the gate structures GT33 and GT34 is set in consideration of the alignment margin of the contact hole CH6, and the location of the contact hole CH6 is set such as to be closer to the gate structure GT34.

A-8. Fifth Modification

Figure 10:
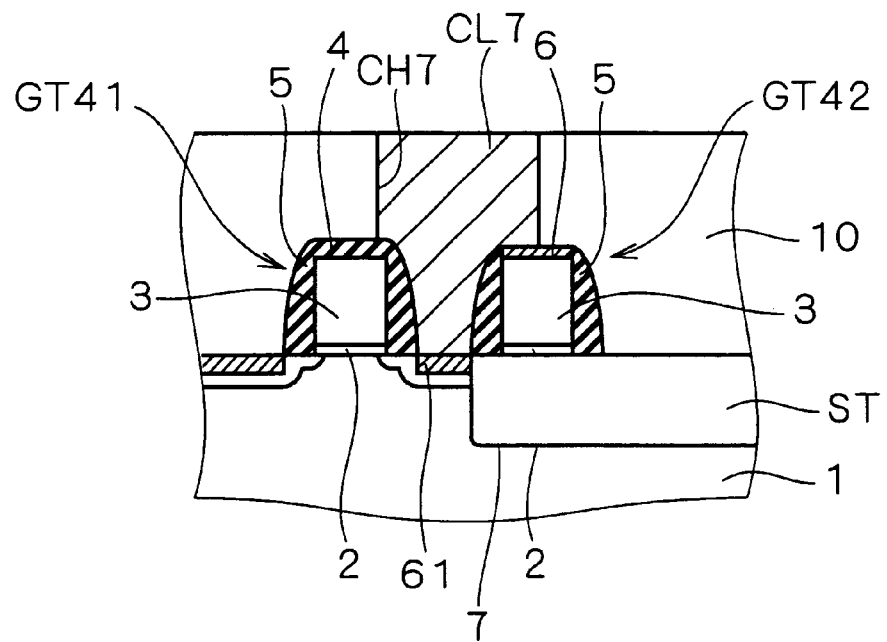
FIG. 10 is a diagram illustrating the construction of a fifth modification of the semiconductor device of the first preferred embodiment.

Although the gate structure GT32 connected by the shared contact as shown in FIG. 8 is disposed on the silicon substrate 1 to form the MOS transistor, it can be constructed such as to function as a gate wiring, as shown in FIG. 10.

Referring to FIG. 10, gate structures GT41 and GT42 are disposed, a predetermined distance apart, on a silicon substrate 1 and STI film ST, respectively.

The gate structure GT41 comprises a gate oxide film 2 on the silicon substrate 1, a gate electrode 3 which is formed from polysilicon and disposed on the gate oxide film 2, an upper nitride film 4 on the gate electrode 3, and a sidewall nitride film 5 disposed such as to make contact with the side faces of the upper nitride film 4, gate electrode 3 and gate oxide film 2.

The gate structure GT42 comprises a gate oxide film 2 on the STI film ST, gate electrode 3 which is formed from polysilicon and disposed on the gate oxide film 2, a salicide layer 6 which is formed from cobalt salicide and disposed on the gate electrode 3, and a sidewall nitride film 5 disposed such as to make contact with the side faces of the salicide layer 6, gate electrode 3 and gate oxide film 2.

A source/drain layer 7 is disposed in the surface of the silicon substrate 1 lying on both sides of the gate structure GT41, and a salicide layer 61 formed from cobalt salicide is disposed on the surface of the source/drain layer 7.

An interlayer insulating film 10 formed from a silicon oxide film is disposed such as to cover the gate structures GT41 and GT42. A contact hole CH7 penetrating the interlayer insulating film 10 is disposed such as to reach the source/drain layer 7 between the gate structures GT41 and GT42. A conductor layer CL7 formed from, for example, tungsten is buried in the contact hole CH7.

The contact hole CH7 is disposed such as to engage the salicide layer 6 of the gate structure GT42, and the conductor layer CL7 functions as the shared contact that provides an electrical connection between the salicide layer 6 (namely, the gate electrode 3) and the salicide layer 61 (namely, the source/drain layer 7).

Since the gate structure GT42 functions as a gate wiring, there is formed no transistor of diode connection even if the gate electrode 3 is connected to the source/drain layer 7 by the shared contact.

Thus, even in the gate wiring on the STI film ST, the resistance of the gate structure GT42 can be lowered by disposing the salicide layer 6 on the upper part of the gate electrode 3, and the gate electrode 3 can be connected to the source/drain layer 7 by the shared contact. This simplifies the step of connecting the gate electrode 3 to the source/drain layer 7.

In this case, the opening size of the contact hole Cr7 is determined in a self-aligned manner by the distance between the gate structure, GT41 and GT42, and the gate structures GT41 and GT42 can be disposed without being restricted by the alignment margin of the contact hole CH7. Therefore, the distance between the gates can be reduced for attaining high integration. To reduce the distance between the gates means to reduce the area of the source/drain layer, which lowers junction capacitance for achieving high speed operation.

It is, of course, possible to widen the range of application by using in combination with the SAC structure and salicide structure as shown in FIG. 1.

A-9. Sixth Modification

Figure 11:
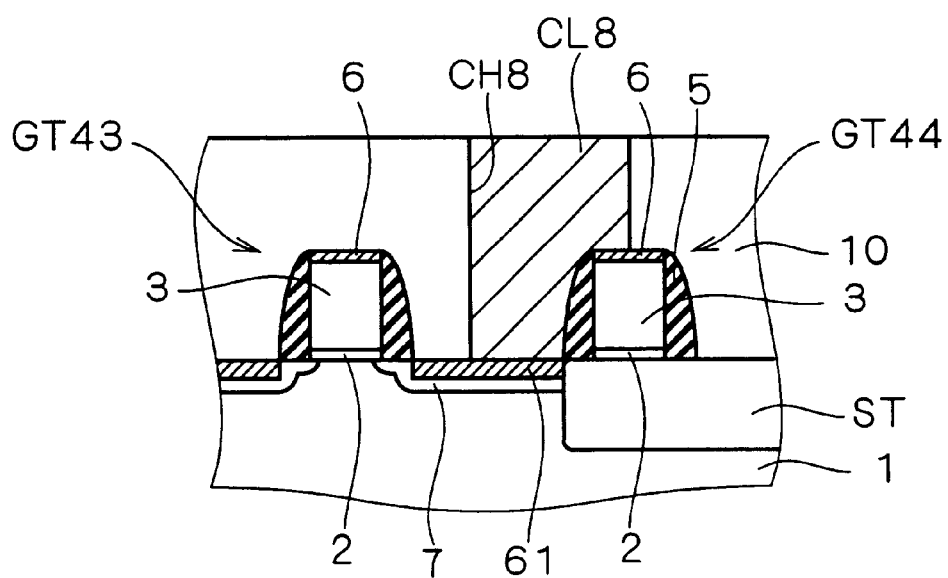
FIG. 11 is a diagram illustrating the construction of a sixth modification of the semiconductor device of the first preferred embodiment.

Although the gate structure GT34 connected by the shared contact as shown in FIG. 9 is disposed on the silicon substrate 1 to form the MOS transistor, it can be constructed such as to function as a gate wiring, as shown in FIG. 11.

Referring to FIG. 11, gate structures GT43 and GT44 are disposed, a predetermined distance apart, on a silicon substrate 1 and STI film ST, respectively.

The gate structures GT43 and GT44 comprise a gate oxide film 2 on the silicon substrate 1, a gate electrode 3 which is formed from polysilicon and disposed on the gate oxide film 2, a salicide layer 6 on the gate electrode 3, and a sidewall nitride film 5 disposed such as to make contact with the side faces of the salicide layer 6, gate electrode 3 and gate oxide film 2.

A source/drain layer 7 is disposed in the surface of the silicon substrate 1 lying on both sides of the gate structure GT43, and a salicide layer 61 formed from cobalt salicide is disposed on the surface of the source/drain layer 7.

An interlayer insulating film 10 formed from a silicon oxide film is disposed such as to cover the gate structures GT43 and GT44. A contact hole CH8 penetrating the interlayer insulating film 10 is disposed such as to reach the source/drain layer 7 between the gate structures GT43 and GT44. A conductor layer CL8 formed from, for example, tungsten is buried in the contact hole CH8.

The contact hole CH8 is disposed such as to engage the salicide layer 6 of the gate structure GT44, and the conductor layer CL8 functions as the shared contact that provides an electrical connection between the salicide layer 6 (namely, the gate electrode 3) and the salicide layer 61 (namely, the source/drain layer 7).

Since the gate structure GT44 functions as a gate wiring, no transistor of diode connection is formed even if the gate electrode 3 is connected to the source/drain layer 7 by the shared contact.

Thus, even in the gate wiring on the STI film ST, the resistance of the gate structure GT44 can be lowered by disposing the salicide layer 6 on the upper part of the gate electrode 3, and the gate electrode 3 can be connected to the source/drain layer 7 by the shared contact. This simplifies the step of connecting the gate electrode 3 to the source/drain layer 7.

It is, of course, possible to widen the range of application by using in combination with the SAC structure and salicide structure as shown in FIG. 1.

Since the salicide layer 6 is present on the upper part of the gate electrode 3 of the gate structure GT43, upon engagement of the contact hole CH8 with the salicide layer 6, short-circuit will be developed between the conductor layer CL8 and gate electrode 3, resulting in operational disadvantages. Therefore, the distance between the gate structures GT43 and GT44 is set in consideration of the alignment margin of the contact hole CH8, and the location of the contact hole CH8 is set such as to be closer to the gate structure GT44.

A-10. Seventh Modification

In the third to sixth modifications with reference to FIGS. 8 to 11, the description has been made of the construction that the gate electrode and source/drain layer in the gate of salicide structure are electrically connected by the shared contact. What is connected by the shared contact is not limited to the gate electrode and source/drain layer. Description will be now made of other applications of shared contact.

Figure 12:
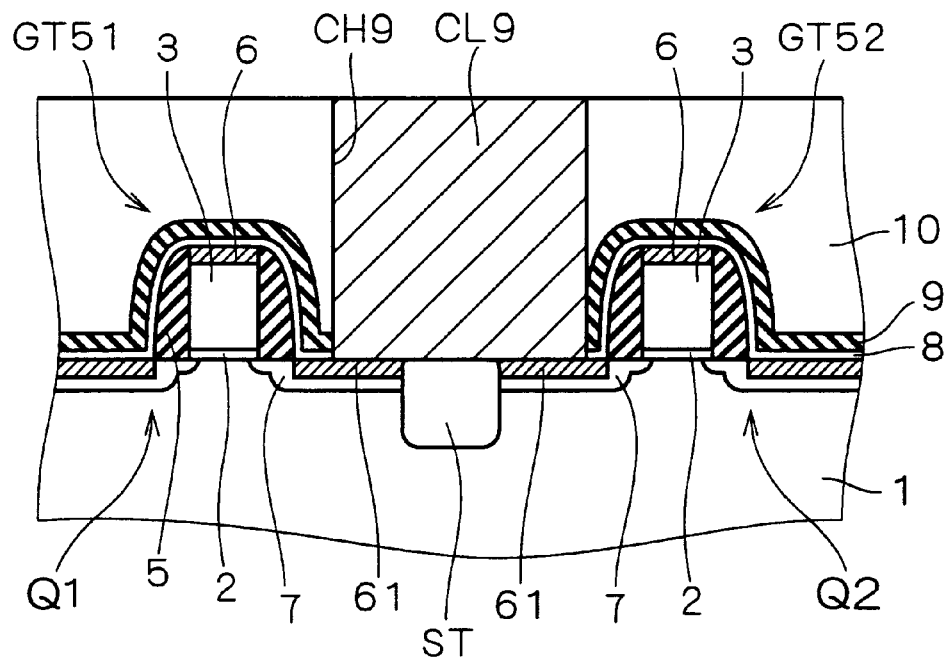
FIG. 12 is a diagram illustrating the construction of a seventh modification of the semiconductor device of the first preferred embodiment.

FIG. 12 is a cross section illustrating the construction of the shared contact connecting different active regions.

Referring now to FIG. 12, MOS transistors Q1 and Q2, each being isolated by a STI film ST, are disposed on a silicon substrate 1.

The MOS transistors Q1 and Q2 have gate structures GT51 and GT52, respectively, and a source/drain layer 7 disposed in the surface of the silicon substrate 1 lying on both sides of the gate structures GT51 and GT52. A salicide layer 61 formed from cobalt salicide is disposed on the surface of the source/drain layer 7.

The gate structures GT51 and GT52 comprise a gate oxide film 2 on the silicon substrate 1, a gate electrode 3 which is formed from polysilicon and disposed on the gate oxide film 2, a salicide layer 6 on the gate electrode 3, and a sidewall nitride film 5 disposed such as to make contact with the side faces of the salicide layer 6, gate electrode 3 and gate oxide film 2.

An oxide film 8 and nitride film 9 which are disposed such as to follow the contours of the gate structures GT51 and GT52 remain partially on the upper part of the structures GT51 and GT52. The nitride film 9 functions as an etching stopper, as described later.

An interlayer insulating film 10 formed from a silicon oxide film is disposed such as to cover the gate structures GT51 and GT52, including the nitride film 9. A contact hole CH9 penetrating the interlayer insulating film 10 is disposed such as to reach the source/drain layer 7 of the MOS transistors Q1 and Q2 having sandwiched therebetween the STI film ST, and the STI film ST. A conductor layer CL9 formed from, for example, tungsten is buried in the contact hole CH9, to form the shared contact that connects concurrently the source/drain layers 7 on which the MOS transistors Q1 and Q2 are provided together.

The contact hole CH9 is disposed such as not to engage the salicide layer 6 of the gate structures GT51 and GT52.

This construction enables to simplify the step of electrically connecting the two active regions having sandwiched therebetween an isolation insulating film for electrical isolation.

It is, of course, possible to widen the range of application by using in combination with the SAC structure and salicide structure as shown in FIG. 1.

It is also, of course, possible to let the gate structures GT51 and GT52 have an upper nitride film on the gate electrode 3. In such a case, the gate structures form the SAC structure, thereby the distance between the gate structures can be reduced.

Referring now to FIGS. 13 to 17 illustrating a sequence of manufacturing steps, a method of manufacturing a semiconductor device with the construction shown in FIG. 12 will be described as below.

Figure 13:
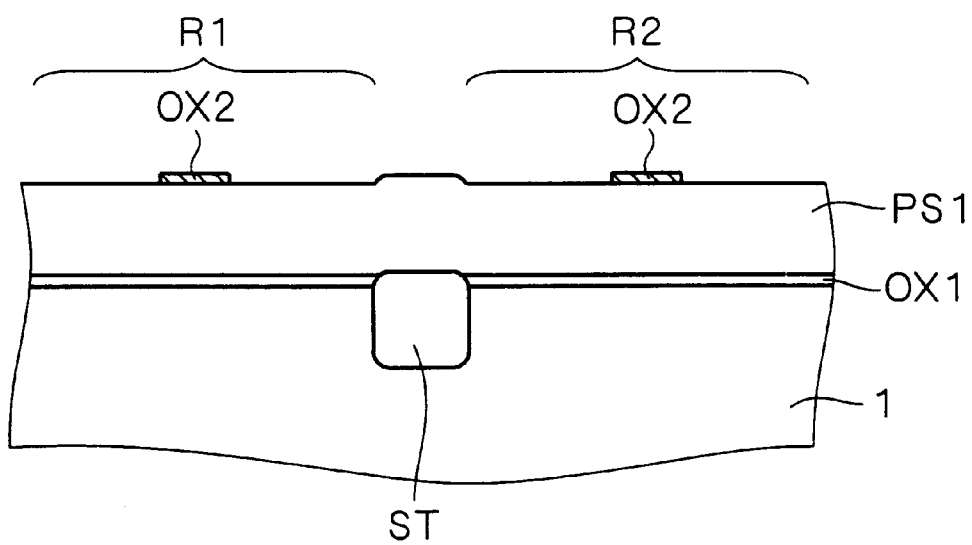
FIGS. 13 to 17 are diagrams illustrating a sequence of manufacturing steps of the semiconductor device of the seventh modification.

Firstly, there is prepared a silicon substrate 1 which is isolated into a first region R1 and second region R2 by a STI film ST. In the step of FIG. 13, an oxide film OX1 is formed on the silicon substrate 1, and a polysilicon layer PS1 is formed on the oxide film OX1. Then, for example, a TEOS oxide film OX2 is selectively formed on the polysilicon layer PS1 by photolithography.

The location of the oxide film OX2 corresponds to that of the gate structures GT51 and GT52 shown in FIG. 12.

Figure 14:
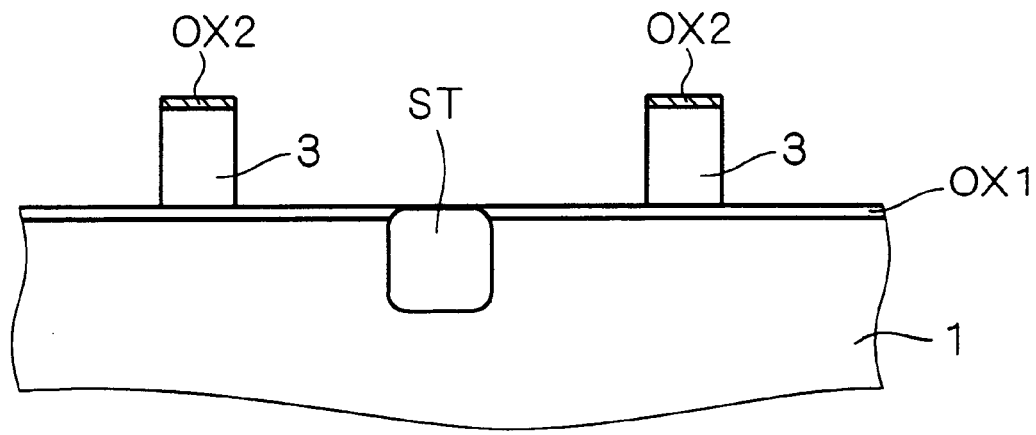

In the step of FIG. 14, by using the TEOS oxide film OX2 as a mask, the polysilicon layer PS1 is etched away to expose the oxide film OX1. The TEOS oxide film OX2 and oxide film OX1 are removed by etching, to form a gate electrode 3 and gate oxide film 2.

Then, by using the gate electrode 3 as a mask, impurity ions are implanted into the silicon substrate 1, to form a lightly doped drain layer 71.

After a nitride film is formed entirely, a sidewall nitride film 5 is formed by anisotropic etching. At this time, the etching is performed such as to expose the surface of the gate electrode 3.

Figure 15:
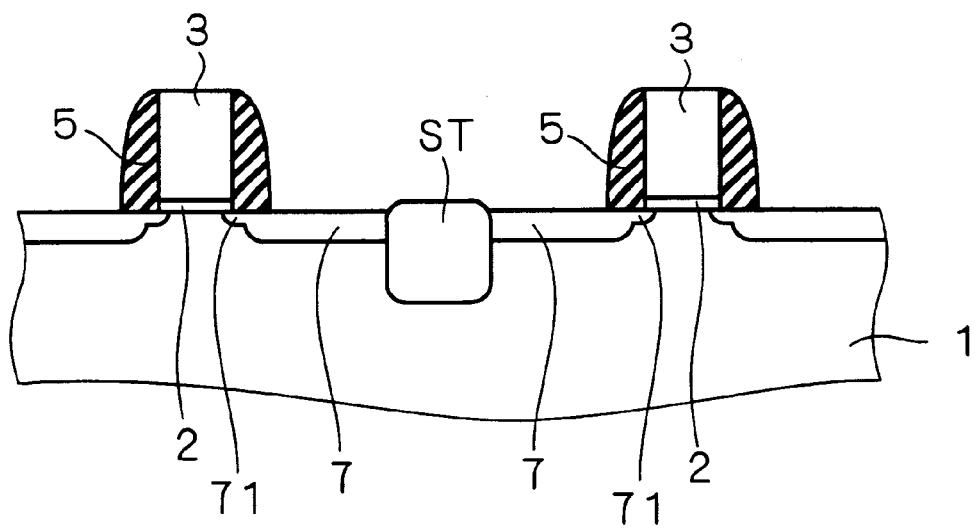

Then, by using the sidewall nitride film 5 and gate electrode 3 as masks, impurity ions are implanted into the silicon substrate 1 to form a source/drain layer 7, resulting in the structure shown in FIG. 15.

Figure 16:
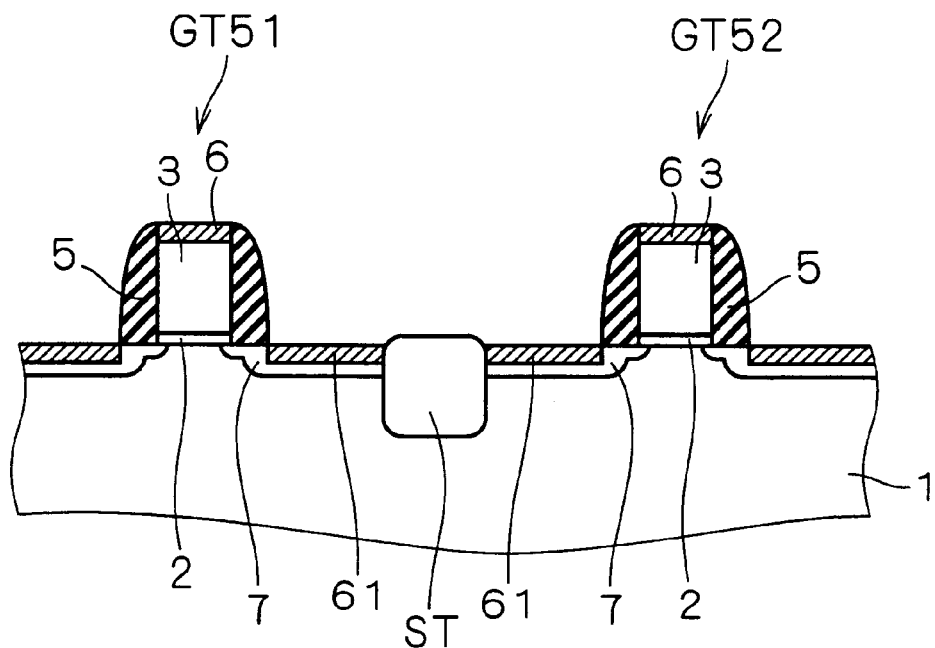

In the step of FIG. 16, after a cobalt layer is formed entirely, by RTA treatment using a ramp heating furnace, a cobalt salicide is formed on the surface of the silicon substrate 1 and on the polysilicon surface, and the unreacted cobalt layer is then removed to form salicide layers 6 and 61 on the gate electrode 3 and on the source/drain layer 7, resulting in gate structures GT51 and GT52.

Figure 17:
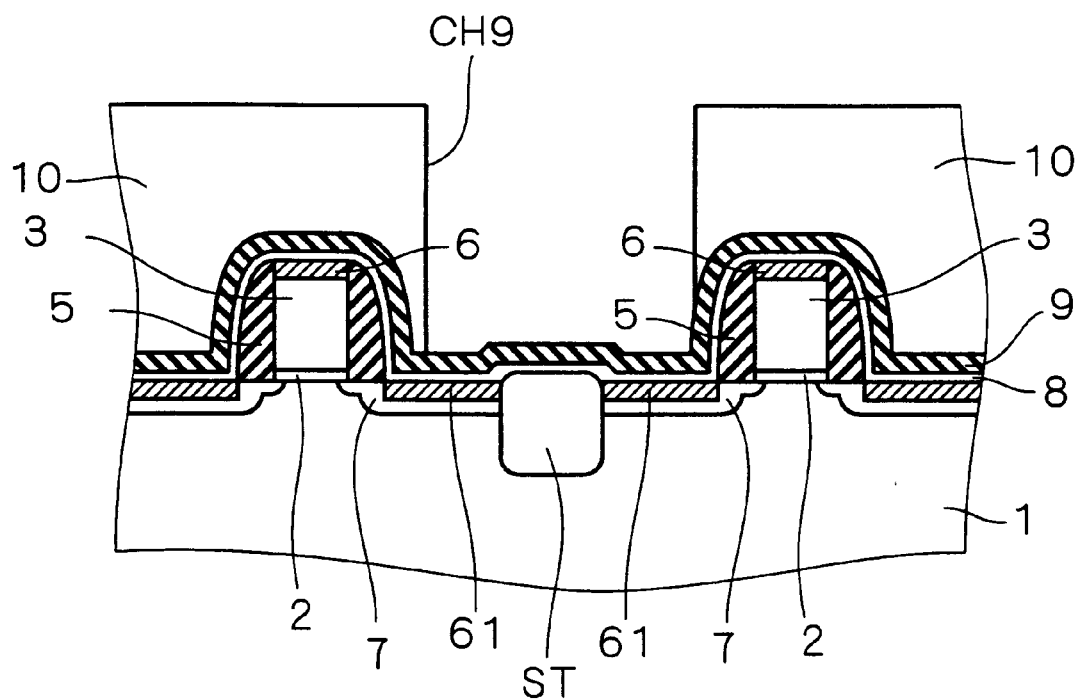

In the step of FIG. 17, an oxide film 8 is formed along the contours of the gate structures GT51 and GT52, and such as to cover the source/drain layer 7. Thereafter, a nitride film 9 is formed on the oxide film 8. The oxide film 8 functions as a protection film of the silicon substrate 1 and the like.

Subsequently, an interlayer insulating film 10 is formed by forming an oxide film such as to cover the gate structures GT51 and GT52, including the nitride film 9, followed by planarization. A contact hole CH9 penetrating the interlayer insulating film 10 is formed such as to reach the nitride film 9 which overlies the source/drain layers 7 having sandwiched therebetween the STI film ST, and the upper part of STI film ST. At this time, the nitride film 9 functions as an etching stopper. When the etching of the contact hole 9 proceeds to the top of the nitride film 9, the etching rate is lowered and substantially terminated. The reason for this is that the nitride film 9 and interlayer insulating film 10 are of distinctively different selective etching ratios.

The reason of providing such an etching stopper is to reduce over etching and prevent the STI film ST from being cut away to excess. Although in the foregoing first preferred embodiment and first to sixth modifications, no description has been made of an etching stopper, this is because there is no construction for forming a contact hole to be engaged with a STI film ST. However, if used in combination with the construction of the foregoing modifications, it should be necessary to provide an etching stopper.

Subsequently, the nitride film 9 of the bottom of the contact hole CH9 and the underlying oxide film 8 are removed such that the contact hole CH9 reaches the upper part of the source/drain layer 7 and STI film ST. Finally, a conductor layer CL9 formed from tungsten is buried in the contact hole CH9, resulting in the construction shown in FIG. 12.

A-11. Eighth Modification

In the seventh modification with reference to FIG. 12, the shared contact connecting the different active regions has been described. It is also possible to form a shared contact to provide a connection between different active regions and gate, as shown in FIG. 18.

Figure 18:
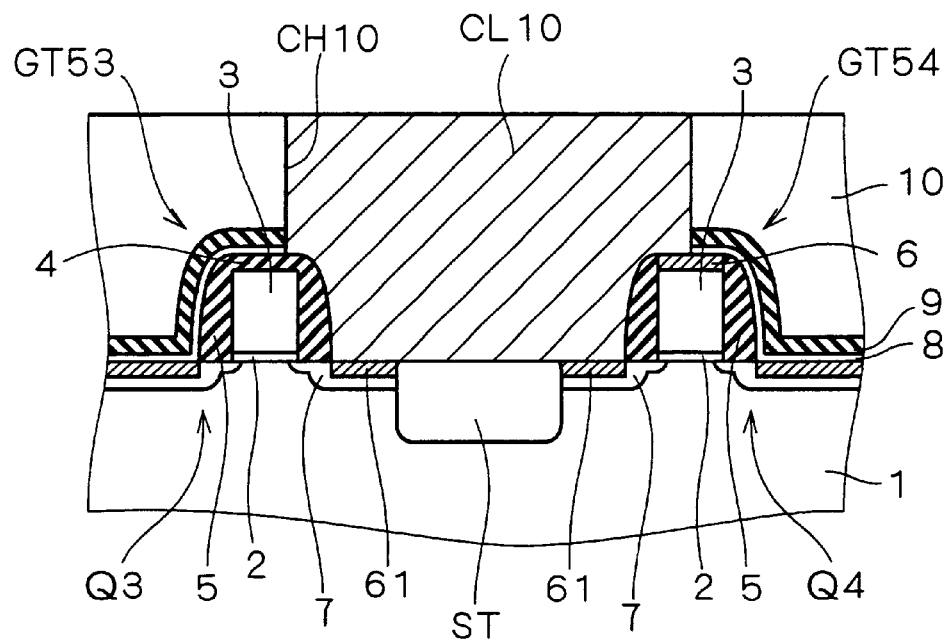
FIG. 18 is a diagram illustrating the construction of an eighth modification of the semiconductor device of the first preferred embodiment.

Referring now to FIG. 18, MOS transistors Q3 and Q4, each being isolated by a STI film ST, are disposed on a silicon substrate 1.

The MOS transistors Q3 and Q4 have gate structures GT53 and GT54, respectively, and a source/drain layer 7 disposed in the surface of the silicon substrate 1 lying on both sides of the gate structures GT53 and GT54. A salicide layer 61 formed from cobalt salicide is disposed on the surface of the source/drain layer 7.

The gate structure GT53 comprises a gate oxide film 2 on the silicon substrate 1, a gate electrode 3 which is formed from polysilicon and disposed on the gate oxide film 2, an upper nitride film 4 on the gate electrode 3, and a sidewall nitride film 5 disposed such as to make contact with the side faces of the upper nitride film 4, gate electrode 3 and gate oxide film 2.

The gate structures GT54 comprises a gate oxide film 2 on the silicon substrate 1, a gate electrode 3 which is formed from polysilicon and disposed on the gate oxide film 2, a salicide layer 6 on the gate electrode 3, and a sidewall nitride film 5 disposed such as to make contact with the side faces of the salicide layer 6, gate electrode 3 and gate oxide film 2.

An oxide film 8 is disposed along the contours of the gate structures GT53 and GT54, and a nitride film 9 is disposed on the oxide film 8.

An interlayer insulating film 10 formed from a silicon oxide film is disposed such as to cover the gate structures GT53 and GT54, including the nitride film 9. A contact hole CH10 penetrates the interlayer insulating film 10 to reach the source/drain layer 7 of the MOS transistors Q3 and Q4 having sandwiched therebetween the STI film ST, and the STI film ST, and also engages the salicide layer 6 of the gate structure GT54. A conductor layer CL10 formed from, for example, tungsten is buried in the contact hole CH10, thereby forming the shared contact that connects concurrently the respective source/drain layers 7 of the MOS transistors Q3 and Q4, and the gate electrode 3 of the gate structure GT54.

This construction enables to simplify the step of electrically connecting the two active regions having sandwiched therebetween an isolation insulating film for electrical isolation.

It is, of course, possible to widen the range of application by using in combination with the SAC structure and salicide structure as shown in FIG. 1.

A-12. Ninth Modification

In the seventh and eighth modifications with reference to FIG. 12 and 18, respectively, the shared contact is provided between the two gates. It is also possible to form a shared contact crossing over a gate wiring, as shown in FIG. 19.

Figure 19:
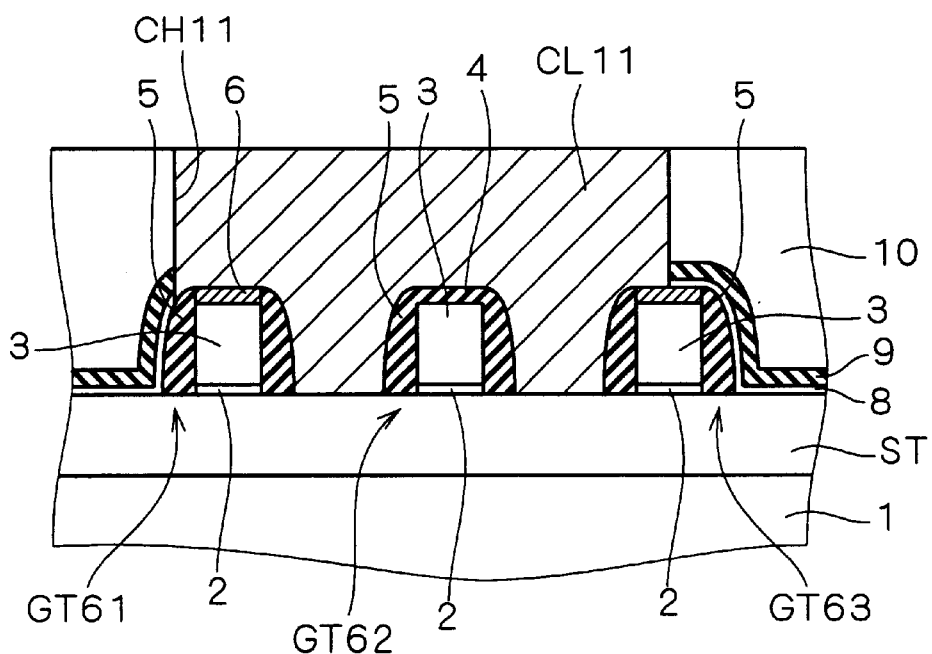
FIG. 19 is a diagram illustrating the construction of a ninth modification of the semiconductor of the first preferred embodiment.

Referring now to FIG. 19, gate structures GT61, GT62 and GT63 are disposed as gate wirings, on a STI film ST disposed on a silicon substrate 1.

The gate structures GT61 and GT63 comprise a gate oxide film 2 on the STI film ST, gate electrode 3 which is formed from polysilicon and disposed on the gate oxide film 2, a salicide layer 6 on the gate electrode 3, and a sidewall nitride film 5 disposed such as to make contact with the side faces of the salicide layer 6, gate electrode 3 and gate oxide film 2.

The gate structure GT62 disposed between the gate structures GT61 and GT63 comprises a gate oxide film 2 on the STI film ST, gate electrode 3 which is formed from polysilicon and disposed on the gate oxide film 2, an upper nitride film 4 on the gate electrode 3, and a sidewall nitride film 5 disposed such as to make contact with the side faces of the upper nitride film 4, gate electrode 3 and gate oxide film 2.

An oxide film 8 and nitride film 9 which are disposed such as to follow the contours of the gate structures GT61 and GT63 remain partially on the upper part of the structures GT61 and GT63.

An interlayer insulating film 10 formed from a silicon oxide film is disposed such as to cover the gate structures GT61 to GT63, including the nitride film 9. A contact hole CH11 penetrates the interlayer insulating film 10 to reach the upper part of the STI film ST, and engages the salicide layers 6 of the gate structures GT61 and GT63 to expose the gate structure GT62. A conductor layer C11 formed from, for example, tungsten is buried in the contact hole CH11, to form the shared contact that connects concurrently the respective gate electrodes 3 of the gate structures GT61 and GT63.

In the gate structure GT62, since the gate electrode 3 is covered with the nitride film, it can be prevented from being exposed due to the etching of the interlayer insulating film 10, and there is no possibility of being electrically connected to the respective gate electrodes 3 of the gate structures GT61 and GT63.

Thus, even when wirings desired to be electrically isolated from each other are present between wirings desired to be electrically connected with each other, a connection between the latter wirings can be made easily by covering the former wirings with a nitride film and disposing a conductor layer such as to cover the nitride film.

This structure realizes simplification of manufacturing steps and increase in the degree of freedom of layout, leading to high integration. Whereas in the conventional construction, a single contact is provided on each wiring desired to be electrically connected, and a connection between the contacts is made through a wiring layer disposed on an interlayer insulating film. As a result, the manufacturing steps is complicated, and there are many limitations upon layout.

It is, of course, possible to widen the range of application by using in combination with the SAC structure and salicide structure as shown in FIG. 1.

A-13. Tenth Modification

In the ninth modification with reference to FIG. 19, the shared contact connecting the gate wirings has been described. It is also possible to form a shared contact that connects the source/drain layers of electrically isolated two MOS transistors crossing over a gate wiring, as shown in FIG. 20.

Figure 20:
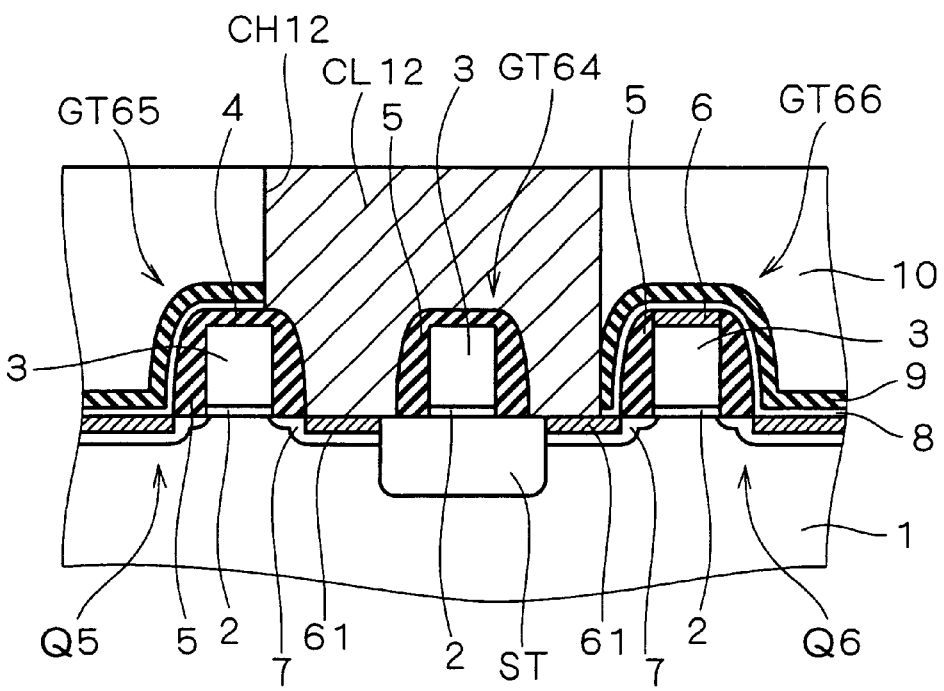
FIG. 20 is a diagram illustrating the construction of a tenth modification of the semiconductor device of the first preferred embodiment.

Referring now to FIG. 20, MOS transistors Q5 and Q6, each being isolated by a STI film ST, are disposed on a silicon substrate 1. A gate structure GT64 is disposed as a gate wiring, on the STI film ST.

The MOS transistors Q5 and Q6 have gate structures GT65 and GT66, respectively, and a source/drain layer 7 disposed in the surface of the silicon substrate 1 lying on both sides of the gate structures GT65 and GT66. A salicide layer 61 formed from cobalt salicide is disposed on the surface of the source/drain layer 7.

The gate structure GT64 comprises a gate oxide film 2 on the STI film ST, gate electrode 3 which is formed from polysilicon and disposed on the gate oxide film 2, an upper nitride film 4 on the gate electrode 3, and a sidewall nitride film 5 disposed such as to make contact with the side faces of the upper nitride film 4, gate electrode 3 and gate oxide film 2.

The gate structure GT65 comprises a gate oxide film 2 on the silicon substrate 1, a gate electrode 3 which is formed from polysilicon and disposed on the gate oxide film 2, an upper nitride film 4 on the gate electrode 3, and a sidewall nitride film 5 disposed such as to make contact with the side faces of the upper nitride film 4, gate electrode 3 and gate oxide film 2.

The gate structure GT66 comprises a gate oxide film 2 on the silicon substrate 1, a gate electrode 3 which is formed from polysilicon and disposed on the gate oxide film 2, a salicide layer 6 on the gate electrode 3, and a sidewall nitride film 5 disposed such as to make contact with the side faces of the salicide layer 6, gate electrode 3 and gate oxide film 2.

An oxide film 8 and nitride film 9 which are disposed such as to follow the contours of the gate structures GT65 and GT66 remain partially on the upper parts of the gate structure s GT65 and GT66.

An interlayer insulating film 10 formed from a silicon oxide film is disposed such as to cover the gate structures GT64 to GT66, including the nitride film 9. A contact hole CH12 for exposing the gate structure GT64 penetrates the interlayer insulating film 10 and reaches the source/drain layers 7 having sandwiched therebetween the STI film ST. A conductor layer CL12 formed from, for example, tungsten is buried in the contact hole CH12, thereby forming the shared contact that connects concurrently the respective source/drain layers 7 of the MOS transistor Q5 and Q6.

In the gate structure GT64, since the gate electrode 3 is covered with the nitride film, it can be prevented from being exposed due to the etching of the interlayer insulating film 10, and there is no possibility of being electrically connected to the respective source/drain layers 7 of the gate structures GT65 and GT66.

Thus, even when wirings desired to be electrically isolated from each other are present between active regions having sandwiched therebetween an insulating film, which are desired to be electrically connected with each other, a connection between the active regions can be made easily by covering the wirings with a nitride film and disposing a conductor layer such as to cover the nitride film.

This structure realizes simplification of manufacturing steps and increase in the degree of freedom of layout, leading to high integration. Whereas in the conventional construction, a single contact is provided on wirings desired to be electrically connected, and a connection between the contacts is made through a wiring layer disposed on an interlayer insulating film. As a result, the manufacturing steps is complicated, and there are many limitations upon layout.

It is, of course, possible to widen the range of application by using in combination with the SAC structure and salicide structure as shown in FIG. 1.

Referring again to FIG. 20, since the salicide layer 6 is present on the upper part of the gate electrode 3 of the gate structure GT66, upon engagement of the contact hole CH12 with the salicide layer 6, short-circuit will be developed between the conductor layer CL12 and gate electrode 3, resulting in operational disadvantages, the distance between the gate structures GT65 and GT66 is set in consideration of the alignment margin of the contact hole CH12. In the case where in the gate structure GT66 the gate electrode 3 is covered with a nitride film as in the gate structure GT65, the gate structures GT65 and GT66 can form the SAC structure. The opening size of the contact hole CH12 is determined in a self-aligned manner by the distance between the gate structures GT65 and GT66, and the gate structures GT65 and GT66 can be disposed with out being restricted by the alignment margin of the contact hole CH12. Therefore, the distance between the gates can be reduced for attaining high integration. To reduce the distance between the gates means to reduce the area of the source/drain layer, which lowers junction capacitance for achieving high speed operation.

A-14. Eleventh Modification

In the tenth modification with reference to FIG. 20, the shared contact connecting the active regions has been described. It is also possible to form a shared contact that connects the active region of a MOS transistor and a gate wiring, while crossing over the gate wiring, as shown in FIG. 21.

Figure 21:
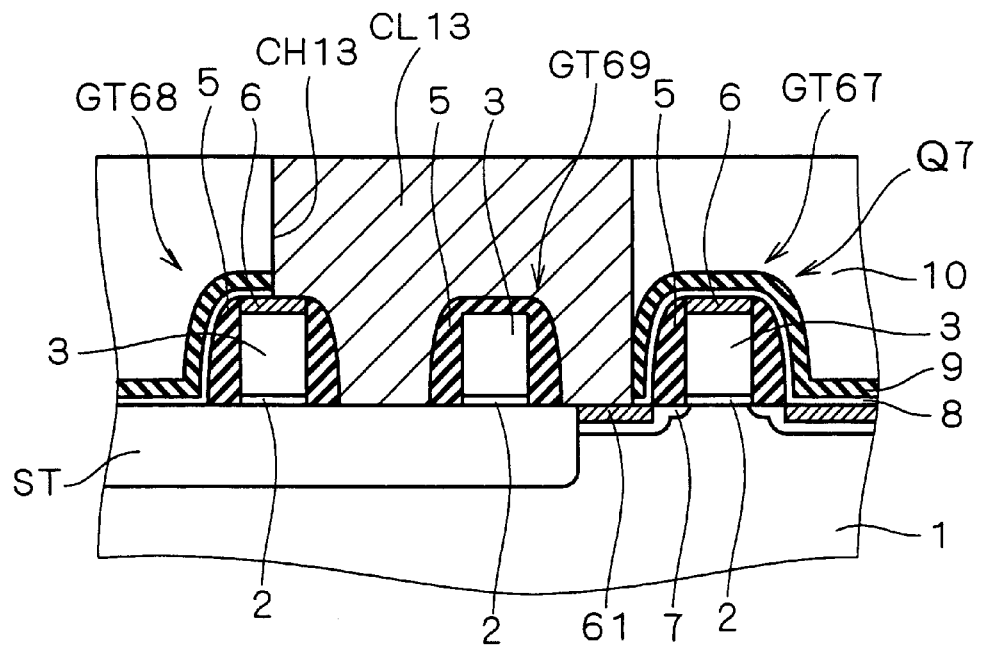
FIG. 21 is a diagram illustrating the construction of an eleventh modification of the semiconductor device of the first preferred embodiment.

Referring now to FIG. 21, a MOS transistor Q7 is disposed on a silicon substrate 1, and gate structures GT68 and GT69 are disposed as gate wirings, on a STI film ST disposed on the silicon substrate 1.

The MOS transistor Q7 has a gate structure GT67, and a source/drain layer 7 disposed in the surface of the silicon substrate 1 lying on both sides of the gate structure GT67. A salicide layer 61 formed from cobalt salicide is disposed on the surface of the source/drain layer 7.

The gate structure GT67 comprises a gate oxide film 2 on the silicon substrate 1, a gate electrode 3 which is formed from polysilicon and disposed on the gate oxide film 2, a salicide layer 6 on the gate electrode 3, and a sidewall nitride film 5 disposed such as to make contact with the side faces of the salicide layer 6, gate electrode 3 and gate oxide film 2.

The gate structure GT68 comprises a gate oxide film 2 on the STI film ST, a gate electrode 3 which is formed from polysilicon and disposed on the gate oxide film 2, a salicide layer 6 on the gate electrode 3, and a sidewall nitride film 5 disposed such as to make contact with the side faces of the salicide layer 6, gate electrode 3 and gate oxide film 2.

The gate structure GT69 disposed between the gate structures GT67 and GT68 comprises a gate oxide film 2 on th e STI film ST, a gate electrode 3 which is formed from polysilicon and disposed on the gate oxide film 2, an upper nitride film 4 on the gate electrode 3, and a sidewall nitride film 5 disposed such as to make contact with the side faces of the upper nitride film 4, gate electrode 3 and gate oxide film 2.

An oxide film 8 and nitride film 9 which are disposed along the contours of the gate structures GT67 and GT68 remain partially on the upper part of the structures GT67 and GT68.

An interlayer insulating film 10 formed from a silicon oxide film is disposed such as to cover the gate structures GT67 to GT69, including the nitride film 9. A contact hole CH13 is disposed which penetrates the interlayer insulating film 10 to reach the source/drain layer 7 of the MOS transistor Q7 adjacent to the STI film ST, engages the gate electrode 3 of the gate structure GT68, and exposes the gate structure GT69. A conductor layer CL13 formed from, for example, tungsten is buried in the contact hole CH13, to form a shared contact that connects concurrently the source/drain layer 7 of the MOS transistor Q7 and the gate electrode 3 of the gate structure GT68.

In the gate structure GT69, since the gate electrode 3 is covered with the nitride film, it can be prevented from being exposed due to the etching of the interlayer insulating film 10, and there is no possibility of being electrically connected to the gate electrode 3 of the gate structure GT68 and the source/drain layer 7 of the MOS transistor Q7.

Thus, even when wirings desired to be electrically is orated from each other are present between a wiring and active region desired to be electrically connected with each other, a connection between the latter wiring and active region can be made easily by covering the former wirings with a nitride film and disposing a conductor layer such as to cover the nitride film.

This structure realizes simplification of manufacturing steps and increase in the degree of freedom of layout, leading to high integration. Whereas in the conventional construction, a single contact is provided on a wiring and active region desired to be electrically connected with each other, and a connection between the contacts is made through a wiring layer disposed on an interlayer insulating film. As a result, the manufacturing steps is complicated, and there are many limitations upon layout.

It is, of course, possible to widen the range of application by using in combination with the SAC structure and salicide structure as shown in FIG. 1.

Referring again to FIG. 21, since the gate structure GT67 is of salicide structure, upon engagement of the contact hole CH13 with the salicide layer 6, short-circuit will be developed between the conductor layer CL13 and gate electrode 3, resulting in operational disadvantages. Therefore, the distance between the gate structures GT67 and GT68 is set in consideration of the alignment margin of the contact hole CH13. In the case where in the gate structure GT67 the gate electrode 3 is covered with a nitride film as in the gate structure GT69, the opening size of the contact hole CH13 is determined in a self-aligned manner by the distance between the gate structures GT67 and GT68, and the gate structures GT67 and GT68 can be disposed without being restricted by the alignment margin of the contact hole CH13. Therefore, the distance between the gates can be reduced for attaining high integration. To reduce the distance between the gates means to reduce the area of the source/drain layer, which lowers junction capacitance for achieving high speed operation.

A-15. Twelfth Modification

Figure 22:
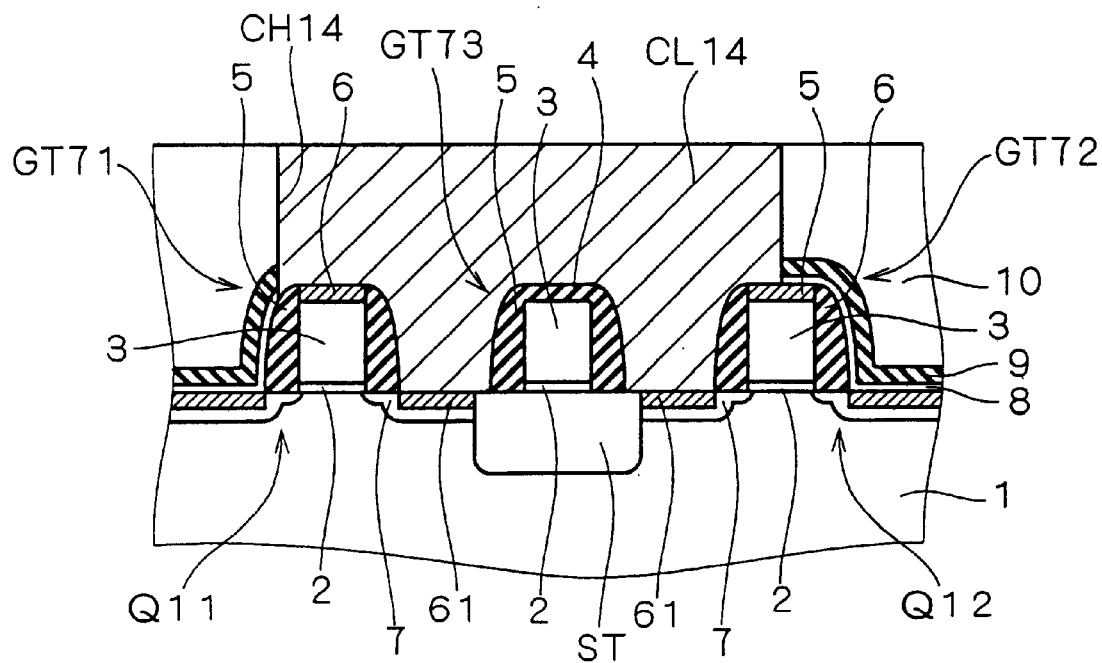
FIG. 22 is a diagram illustrating the construction of a twelfth modification of the semiconductor device of the first preferred embodiment.

FIG. 22 illustrates the construction of a shared contact that connects between the active regions of electrically isolated MOS transistors, while crossing over a gate wiring, and also connects the gate electrodes of the MOS transistors.

Referring to FIG. 22, MOS transistors Q11 and Q12, each being isolated by a STI film ST, are disposed on a silicon substrate 1, and a gate structure GT73 is disposed as a gate wiring, on the STI film ST.

The MOS transistors Q11 and Q12 have gate structures GT71 and GT72, respectively, and a source/drain layer 7 disposed in the surface of the silicon substrate 1 lying on both sides of the gate structures GT71 and GT72. A salicide layer 61 formed from cobalt salicide is disposed on the surface of the source/drain layer 7.

The gate structure GT73 comprises a gate oxide film 2 on the STI film ST, a gate electrode 3 which is formed from polysilicon and disposed on the gate oxide film 2, an upper nitride film 4 on the gate electrode 3, and a sidewall nitride film 5 disposed such as to make contact with the side faces of the upper nitride film 4, gate electrode 3 and gate oxide film 2.

The gate structures GT71 and GT72 comprise a gate oxide film 2 on the silicon substrate 1, a gate electrode 3 which is formed from polysilicon and disposed on the gate oxide film 2, a salicide layer 6 on the gate electrode 3, and a sidewall nitride film 5 disposed such as to make contact with the side faces of the salicide layer 6, gate electrode 3 and gate oxide film 2.

An oxide film 8 and nitride film 9 which are disposed such as to follow the contours of the gate structures GT71 and GT72 remain partially on the upper part of the structures GT71 and GT72.

An interlayer insulating film 10 formed from a silicon oxide film is disposed such as to cover the gate structures GT71 to GT73, including the nitride film 9. A contact hole CH14 is disposed which penetrates the interlayer insulating film 10 to reach the source/drain layers 7 having sandwiched therebetween the STI film ST, and also engages the salicide layers 6 of the gate structures GT71, GT72, and the gate structure GT73. A conductor layer CL14 formed from, for example, tungsten is buried in the contact hole CH14, to form a shared contact that connects concurrently the gate electrodes 3 of the gate structures GT71 and GT72 to the source/drain layers 7 of the MOS transistors Q11 and Q12.

In the gate structure GT72, since the gate electrode 3 is covered with the nitride film, it can be prevented from being exposed due to the etching of the interlayer insulating film 10, and there is no possibility of being electrically connected to the gate electrodes 3 and source/drain layers 7 of the gate structure, GT71 and GT72.

Thus, even when wirings desired to be electrically isolated from each other are present between two MOS transistors having sandwiched therebetween an isolation insulating film, for which it is desired to electrically connect their respective active regions and their respective gate electrodes, a connection between the active regions and a connection between the gate electrodes can be made easily by covering the wirings with a nitride film and disposing a conductor layer such as to cover the nitride film.

This structure realizes simplification of manufacturing steps and increase in the degree of freedom of layout, leading to high integration. Whereas in the conventional construction, a single contact is provided on the active region and gate electrode which are desired to be electrically connected with each other, and a connection between the contacts is made through a wiring layer disposed on an interlayer insulating film. As a result, the manufacturing steps is complicated, and there are many limitations upon layout.

The opening size of the contact hole CH14 is determined in a self-aligned manner by the distance between the gate structures GT71 and GT72, and the gate structures GT71 and GT72 can be disposed without being restricted by the alignment margin of the contact hole CH14. Therefore, the distance between the gates can be reduced for attaining high integration. To reduce the distance between the gates means to reduce the area of the source/drain layer, which lowers junction capacitance for achieving high speed operation.

It is, of course, possible to widen the range of application by using in combination with the SAC structure and salicide structure as shown in FIG. 1.

Although in the foregoing first preferred embodiment and its modifications, the upper nitride film 4 is formed from a nitride film alone, it may be, for example, of two-layer structure consisting of an oxide film and nitride film. That is, the upper nitride film 4 may be constructed such that it is not etched away at the etching of the interlayer insulating film 10, and has no salicide layer.

As an isolation insulating film, the STI film ST is given as an example and without limitation, and a LOCOS film can be used.

B. Second Preferred Embodiment

B-1. Device Construction

The SAC structure formed by the gate structures GT11 and GT12 shown in FIG. 1 is useful in reducing the distance between the gates for achieving high integration because the gate structures GT11 and GT12 can be disposed without being restricted by the alignment margin of the contact hole CH1. Unfortunately, a resistance reduction of the gate electrode 3 is unavailable because no salicide layer is present on the gate electrode 3.

It is however possible to achieve a resistance reduction of the gate electrode 3 by providing SAC structure only in the vicinity of the contact hole CH1 that is a self align contact.

Figure 23:
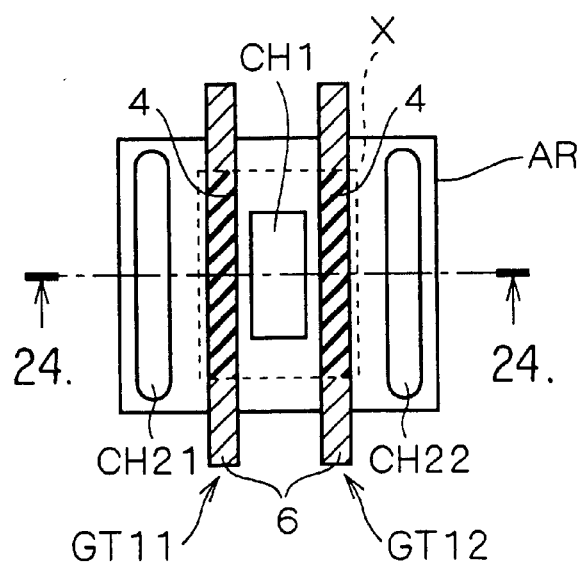
FIG. 23 is a plan view illustrating the construction of a semiconductor device of a second preferred embodiment.
Figure 24:
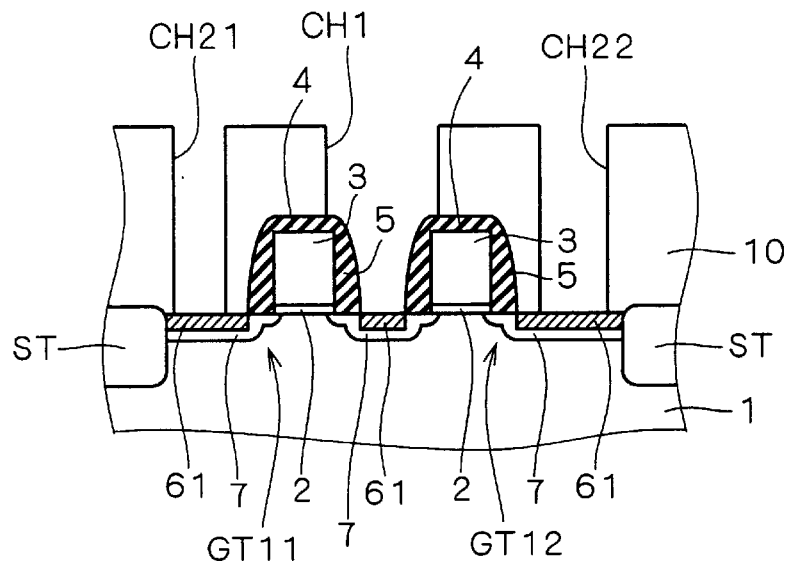
FIG. 24 is a diagram illustrating the construction of the semiconductor device of the second preferred embodiment.

Referring now to FIGS. 23 and 24, the construction that the location of SAC structure is limited to the vicinity of a self align contact will be described as a second preferred embodiment.

FIG. 23 is a plan view illustrating the construction in the vicinity of a self align contact. In FIG. 23, there are shown gate structures GT11 and GT12 disposed in parallel arrangement on an active region AR, a contact hole CH1 disposed between the gate structures GT11 and GT12, and contact holes CH21 and CH22 disposed on the active region AR lying outside of the gate structures GT11 and GT12. The contact holes CH1, CH21 and CH22 may be in the shape of a groove as shown in FIG. 23, or the usual circle.

The gate structures GT11 and GT12 in region X fairly close to the contact hole CH1 have an upper nitride film 4, and the gate structures GT11 and GT12 beyond the region X have a salicide layer 6.

FIG. 24 is a cross section along the line A—A in FIG. 23. Referring to FIG. 24, gate structures GT11 and GT12 are disposed a predetermined distance apart on a silicon substrate 1, a source/drain layer 7 is disposed in the surface of the silicon substrate 1 lying on both sides of the gate structures GT11 and GT12, and a salicide layer 61 formed from cobalt salicide is disposed on the surface of the source/drain layer 7.

Since the construction of the gate structures GT11 and GT12 has been described with reference to FIG. 1, the same description as in the foregoing is omitted herein.

An interlayer insulating film 10 formed from a silicon oxide film is disposed such as to cover the gate structures GT11 and GT12. A contact hole CR1 penetrating the interlayer insulating film 10 is disposed such as to reach the source/drain layer 7 between the gate structures GT11 and GT12. Contact holes CH21 and CH22 are disposed such as to reach the source/drain layer 7 lying outside of the gate structures GT11 and GT12. An active region is defined by a STI film ST.

B-2. Effects

Thus, a resistance reduction of the gate electrode 3 is achievable and high integration is possible while maintaining high speed operation, by limiting the location of the SAC structure to the vicinity of the contact hole CH1 being self align contact and providing the salicide layer 6 on the gate lying at other paris.

B-3. Example of Layout Design

Referring now to FIG. 23, in order to limit the location of the SAC structure to the vicinity of the contact hole CH1 being self align contact, there may be employ such a manner that, at the stage of layout design, an oversize data is created by multiplying data indicating the magnitude of a self align contact by a predetermined coefficient, and the created data is used as the magnitude of the region X. As the predetermined coefficient, various coefficients should be prepared based on the distance between the self align contact and gate, and the gate length.

An automatic setting of the magnitude of the region X facilitates creation of mask data and the like.

B-4. First Modification

As described with reference to FIG. 23, the construction that the SAC structure is limited to the vicinity of the contact hole CH1 being self align contact, is useful in view of not only achieving a resistance reduction of the gate electrode 3 but also preventing formation of a parasitic diode in the boundary of a PN junction in a dual polysilicon gate.

Figure 25:
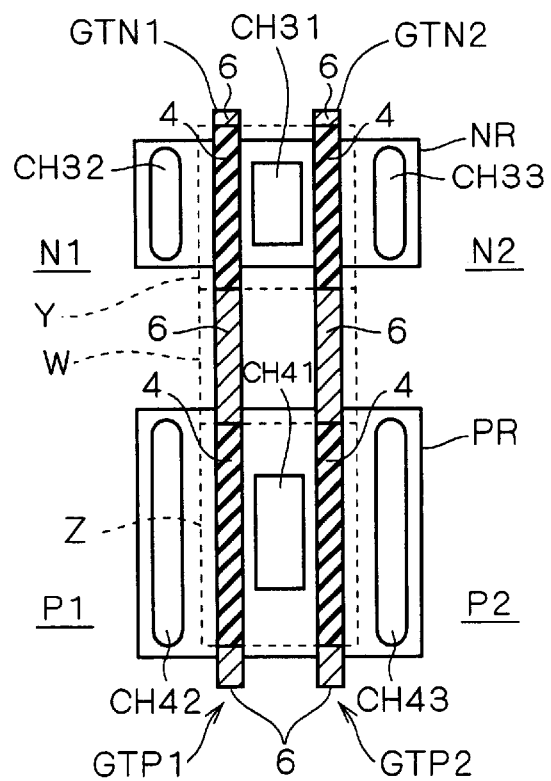
FIG. 25 is a plan view illustrating the construction of a first modification of the semiconductor device of the second preferred embodiment.

Specifically, in the construction shown in FIG. 25 in which N channel type MOS transistors (hereinafter referred to as NMOS transistors) N1 and N2 are disposed in an active region NR, P channel type MOS transistors (hereinafter referred to as PMOS transistors) P1 and P2 are disposed in an active region PR, a gate structure GTN1 of the NMOS transistor N1 is connected to a gate structure GTP1 of the PMOS transistor P1, and a gate structure GTN2 of the NMOS transistor N2 is connected to a gate structure GTP2 of the PMOS transistor P2, there is the possibility that, when an N type impurity and P type impurity are respectively implanted in a relatively high concentration into the gates of the NMOS transistors N1 and N2 and the PMOS transistors P1 and P2, to form a dual polysilicon gate, the junction part of each gate of these transistors becomes a PN junction and a parasitic diode is formed there.

In the region W in the vicinity of the junction of the gates of the NMOS transistors N1 and N2 and the PMOS transistors P1 and P2, formation of a parasitic diode can be avoided by disposing a salicide layer on the gate. It is, of course, possible to reduce the distance between the gates by constructing such that the gates of region Y and region Z in the vicinity of their respective contact holes CH31 and CH41, each being self align contact, are of SAC structure and no salicide layer is disposed.

B-5. Second Modification

In the first modification, the gates in the regions Y and Z in the vicinity of their respective contact holes CH31 and CH41 are of SAC structure. By letting only the gate in the vicinity of one contact hole be SAC structure, the following effects are obtainable.

Figure 26:
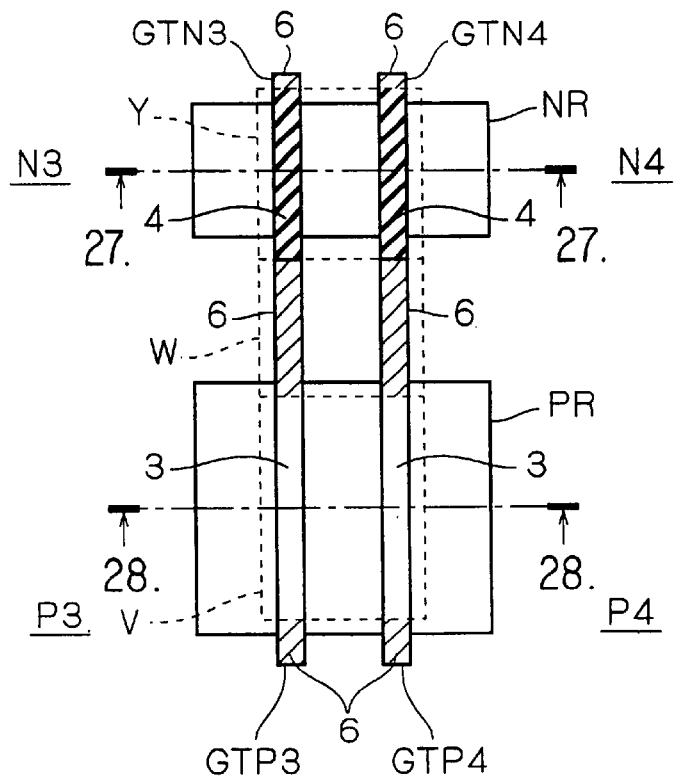
FIG. 26 is a plan view illustrating the construction of a second modification of the semiconductor device of the second preferred embodiment.

FIG. 26 is a diagram illustrating a midway in the formation of NMOS transistors N3 and N4 to be disposed in an active region NR, and PMOS transistors P3 and P4 to be formed in an active region PR. In the construction that a Gate structure GTN3 of the NMOS transistor N3 is connected to a gate structure GTP3 of the PMOS transistor P3, and a gate structure GTN4 of the NMOS transistor N4 is connected to a gate structure GTP4 of the PMOS transistor P4, the gate of region Y becomes SAC structure and neither a salicide layer nor a nitride layer is disposed on the gate in region V. In region W, formation of a parasitic diode is avoidable by disposing a salicide layer 6 on the gate.

Figure 27:
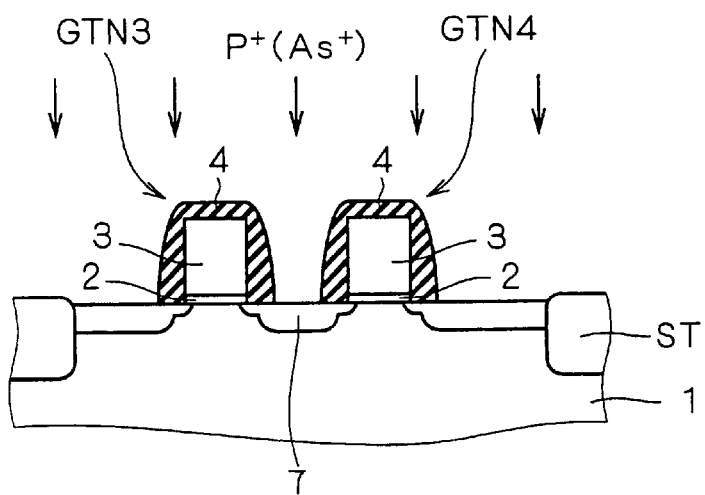
FIG. 27 and 28 are diagrams illustrating the construction of the semiconductor device of the second modification.
Figure 28:
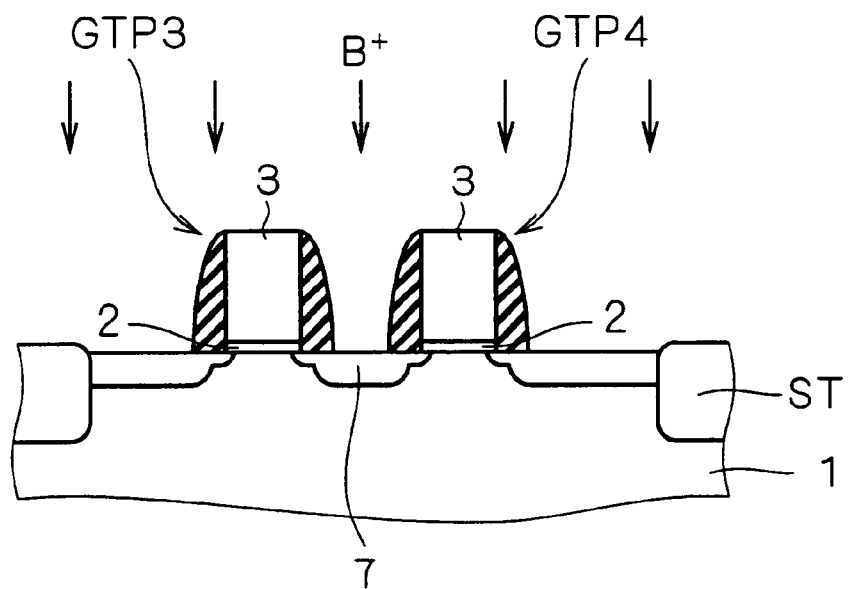

FIGS. 27 and 28 are cross sections along the line B—B and line C—C of FIG. 26, respectively. In FIG. 27, gate structures GTN3 and GTN4 comprise a gate oxide film 2 on a silicon substrate 1, a gate electrode 3 which is formed from polysilicon and disposed on the gate oxide film 2, an upper nitride film 4 on the gate electrode 3, and a sidewall nitride film 5 disposed such as to make contact with the side faces of the upper nitride film 4, gate electrode 3 and gate oxide film 2.

In FIG. 28, gate structures GTP3 and GTP4 comprise a gate oxide film 2 on a silicon substrate 1, a gate electrode 3 which is formed from polysilicon and disposed on the gate oxide film 2, and a sidewall nitride film 5 disposed such as to make contact with the side faces of the gate electrode 3 and gate oxide film 2.

In the NMOS transistors N3 and N4, a source/drain layer 7 is formed by implanting an N type impurity (phosphorus or arsenic) in a relatively high concentration by using the gate structure s GTN3 an d GTN4 as masks. In the PMOS transistors P3 and P4, a source/drain layer 7 is formed by implanting a P type impurity (boron, etc.) in a relatively high concentration by using the gate structures GTP3 and GTP4 as masks. At this time, it is possible to form a dual polysilicon gate by implanting an impurity into their respective gate electrodes 3.

For a dual polysilicon gate, work function is settable and threshold value is adjustable, by the concentration of impurity and activation yield in the gate. The concentration of impurity implanted into the gate is changeable depending upon whether a salicide layer is formed or not on the gate. Therefore, neither a salicide layer nor a nitride film is formed on the gate of a transistor desired to have a large amount of impurity, as in the case with the gate structures GTP3 and GTP4. An upper nitride film 4 is formed on the gate of a transistor desired to have a small amount of impurity and have SAC structure, as in the gate structures GTN3 and CrTN4. That is, when forming a source/drain layer, the amount of an impurity to be implanted into the gate electrode is controlled by the presence/absence of an upper nitride film.

With this construction, for example, the impurity concentration of the gate electrode 3 of the gate structures GTN3 and GTN4 is set to be about a 80% of that of the gate structures GTP3 and GTP4, thereby the NMOS transistors N3 and N4 have a higher threshold value than the PMOS transistors P3 and P4. It is, of course, possible to set the individual impurity concentration for the NMOS transistors and PMOS transistors.

C. Third Preferred Embodiment

The foregoing first and second preferred embodiments have been described with respect to that the employment of SAC structure enables to reduce the distance between the gates for achieving high integration. In this connection, FIG. 29 gives an example of layout in the case of employing SAC structure.

Figure 29:
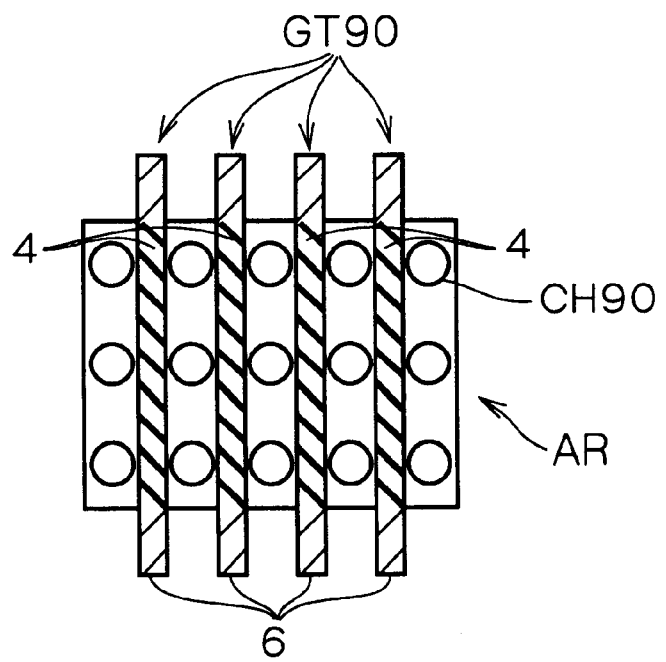
FIGS. 29 and 30 are plan views illustrating the construction of a semiconductor device of a third preferred embodiment.

Referring to FIG. 29, a plurality of gate structures GT90 are disposed in parallel arrangement in an active region AR, and a plurality of contact holes CH90 are disposed between the gates.

In the active region AR, the gate structure GT90 is of SAC structure not silicide, and a salicide layer 6 is disposed on the gate structure GT90 lying outside of the active region AR.

With this construction, the distance (pitch) between the gates can be reduced for achieving high integration. For example, transistors hitherto disposed at 0.7 μm in pitch can be disposed for example at 0.56 μm in pitch, by the employment of SAC structure. Unfortunately, if the same number of contact holes CH90 are disposed between the gate structures GT90 in a similar fashion, the contact holes CH90 are localized. As a result, there is the possibility of causing disadvantages in pattern resolution due to proximity effect and the like, when a resist patterning is performed by photolithography technique at the time of forming contact holes CH90.

Figure 30:
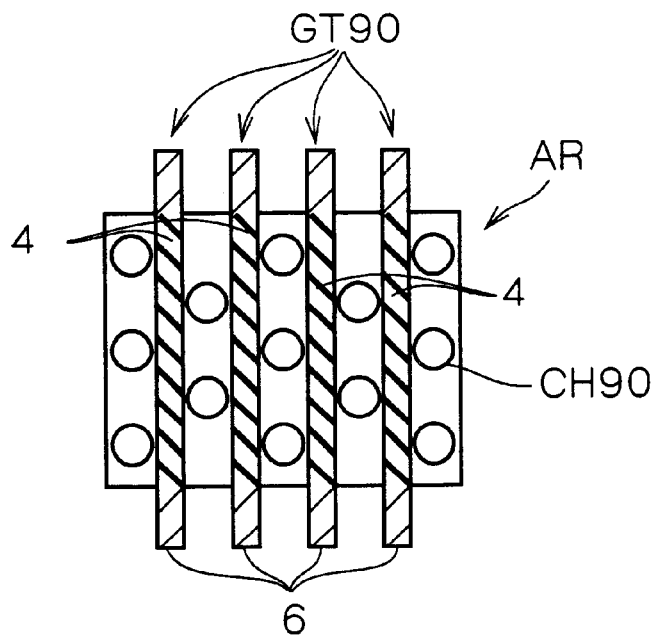
Figure 31:
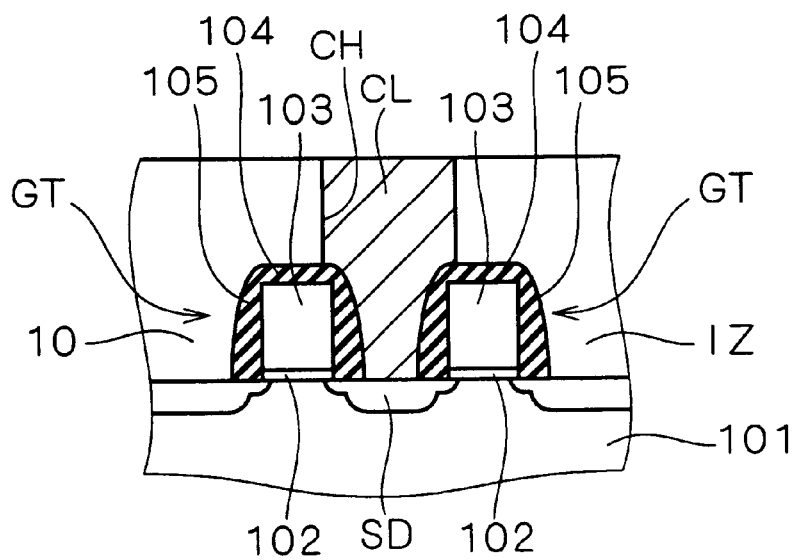
FIG. 31 and 32 are diagrams illustrating a conventional semiconductor device.
Figure 32:
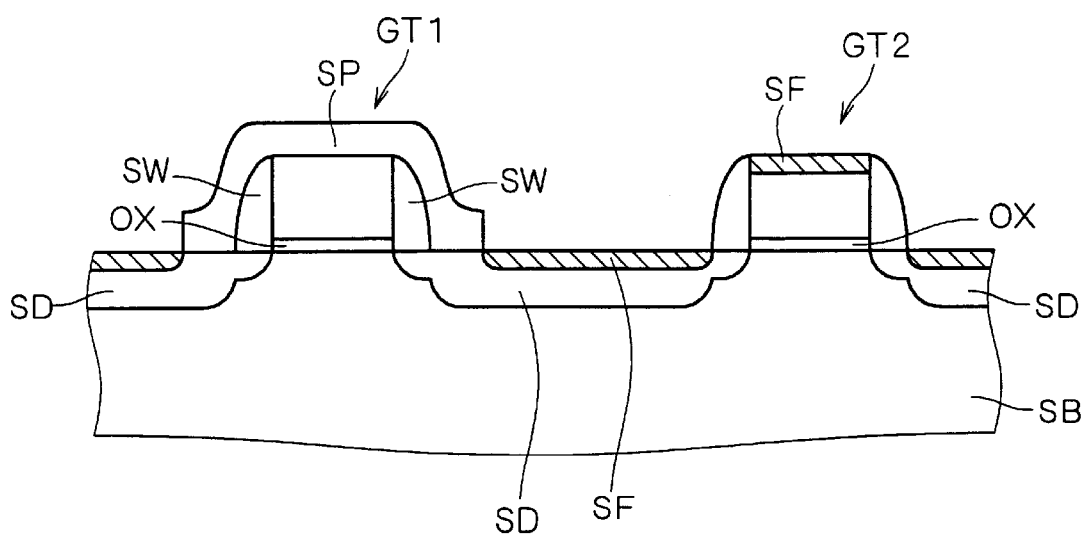
Figure 32:
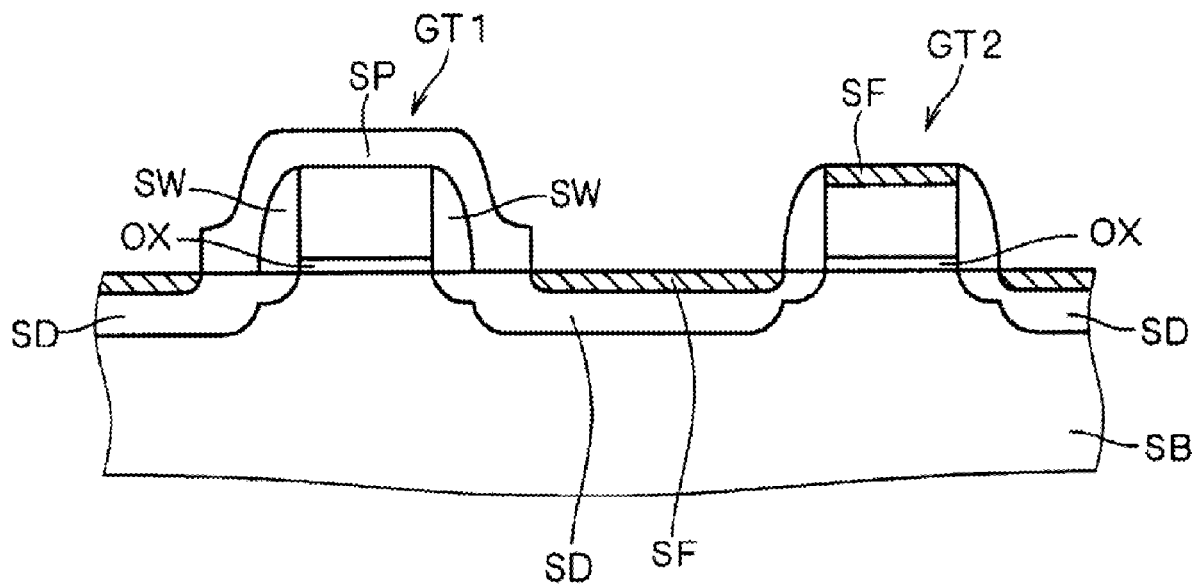

This can be solved by disposing, between the respective gates, contact holes CH90 of different numbers having different array patterns, as shown in FIG. 30.

FIG. 30 gives an example that the localization of contact holes CH90 is lowered by alternating the array of three contact holes CH90 disposed between the gates with the array of two contact holes CH90.

With this construction, the influence due to proximity effect and the like is suppressed, thereby the distance between the gates can be reduced further, for example, as small as about 0.50 μm in pitch.

Even if the number of contact holes CH90 is reduced, an extreme increase in contact resistance is avoidable because the salicide layer formed concurrently with the salicide layer 6 is present between the gates, namely, on the source/drain layer, as described in the first preferred embodiment and its modifications.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device having a plurality of circuit parts that are of different constructions and disposed on a semiconductor substrate, each of said circuit parts comprising:

at least one first and second gate structures disposed on at least either of said semiconductor substrate and an isolation insulating film disposed on said semiconductor substrate;

an interlayer insulating film covering said first and second gate structures; and a plurality of contacts penetrating said interlayer insulating film and reaching at least either of said semiconductor substrate and said isolation insulating film, said at least one first gate structure comprising:
a first gate oxide film;
a first gate electrode disposed on said first gate oxide film;
an upper insulating film disposed on said firs t g ate electrode; and
a first sidewall insulating film disposed on side faces of said upper insulating film, said first gate electrode and said first gate oxide film, said at least one second gate structure comprising:
a second gate oxide film;
a second gate electrode disposed on said second gate oxide film;
a salicide layer disposed on said second gate electrode; and
a second sidewall insulating film disposed on side faces of said salicide layer, said second gate electrode and said second gate oxide film.

2. The semiconductor device according to claim 1 wherein, said at least one first gate structure is a plurality of first gate structures; and said plurality of contacts have a self align contact with which the opening size of said contact hole is determined in a self aligned manner by the distance between said plurality of first gate structures, said self align contact having a contact hole penetrating said interlayer insulating film and reaching said semiconductor substrate, disposed between said plurality of first gate structures in parallel arrangement.

3. The semiconductor device according to claim 2 wherein,
said at least one second gate structure is a plurality of second gate structures;
said semiconductor substrate surfaces on both sides of said plurality of first gate structures have a source/drain layer;
said plurality of first gate structures are disposed in a region in the vicinity of said self align contact; and
said plurality of second gate structures are continuous with said plurality of first gate structures on other regions than said region in the vicinity of said self align contact.

4. The semiconductor device according to claim 3 wherein said gate electrode of said plurality of first gate structures has an impurity of the same conductivity type as that of said source/drain layer.

5. The semiconductor device according to claim 3 further comprising a salicide layer on an upper part of said source/drain layer.

6. The semiconductor device according to claim 2 wherein,
said semiconductor substrate surfaces on both sides of said plurality of first gate structures have a source/drain layer, respectively; and
a plane array pattern of said contact hole is set such that said source/drain layers adjacent each other are of different patterns.

7. The semiconductor device according to claim 1 wherein said plurality of contacts are provided with a shared contact having a contact hole penetrating said interlayer insulating film and reaching said semiconductor substrate and said salicide layer of said at least one second gate structure, said contact hole being disposed between said at least one first and second gate structures in parallel arrangement.

8. The semiconductor device according to claim 7 wherein said at least one second gate structure for engagement with said contact hole is disposed on said isolation insulating film.

9. The semiconductor device according to claim 1 wherein,
said at least one second gate structure is a plurality of second gate structures; and
said plurality of contacts are provided with a shared contact having a contact hole disposed between said plurality of second gate structures in parallel arrangement, said contact hole penetrating said interlayer insulating film, and reaching said semiconductor substrate and said salicide layer of at least either of said plurality of second gate structures.

10. The semiconductor device according to claim 9 wherein said at least one second gate structure for engagement with said contact hole is disposed on said isolation insulating film.

11. The semiconductor device according to claim 1 wherein,
said at least one first and second gate structures are provided together on said semiconductor substrate, having sandwiched therebetween said isolation insulating film;
said semiconductor substrate surfaces on both sides of said at least one first and second gate structures have a source/drain layer, respectively; and
said plurality of contacts are provided with a shared contact having a contact hole disposed between said at least one first and second gate structures, said contact hole penetrating said interlayer insulating film, reaching said source/drain layers having sandwiched therebetween said isolation insulating film, and said isolation insulating film, and reaching said salicide layer of said at least one second gate structure.

12. The semiconductor device according to claim 11 further comprising a salicide layer on an upper part of said source/drain layer.

13. The semiconductor device according to claim 1 further comprising:
a central gate structure that corresponds to said at least one first gate structure and is disposed such as to locate at a relatively center; and
first side and second side gate structures that correspond to either of said at least one first and second gate structures, and are disposed on both sides of said central gate structure, and wherein,
said plurality of con tact s have a contact hole disposed between said first and second side gate structures such as to expose said central gate structure, said contact hole penetrating said interlayer insulating film and reaching at least either of said semiconductor substrate and said isolation insulating film, and have a conductor layer being buried in said contact hole and covering said central gate structure.

14. The semiconductor device according to claim 13 wherein,
said central gate structure and said first and second side gate structures are disposed on said isolation insulating film;
said first and second side gate structures correspond to said at least one second gate structure; and
said contact hole is disposed such as to reach said salicide layer of said first and second side gate structures.

15. The semiconductor device according to claim 13 wherein,
said central gate structure is disposed on said isolation insulating film;
said first and second side gate structures are disposed on said semiconductor substrate, having sandwiched therebetween said isolation insulating film;
said semiconductor substrate surfaces on both sides of said first and second side gate structures have a source/drain layer, respectively; and
said contact hole is disposed such as to reach said source/drain layers having sandwiched therebetween said isolation insulating film of said first and second side gate structures.

16. The semiconductor device according to claim 15 further comprising a salicide layer on an upper part of said source/drain layer.

17. The semiconductor device according to claim 13 wherein,
said central gate structure and said first side gate structure are disposed on said isolation insulating film, and said first side gate structure corresponds to said at least one second gate structure;
said second side gate structure is disposed on said semiconductor substrate;

said semiconductor substrate surfaces on both sides of said second side gate structure have a source/drain layer; and said contact hole is disposed such as to reach said source/drain layer on said isolation insulting layer side of said second side gate structure and reach said silicide layer of said first side gate structure.

18. The semiconductor device according to claim 17 further comprising a salicide layer on an upper part of said source/drain layer.

19. The semiconductor device according to claim 13 wherein, said central gate structure is disposed on said isolation insulating film;

said first and second side gate structures are disposed on said semiconductor substrate, having sandwiched therebetween said isolation insulating film;

said semiconductor substrate surfaces on both sides of said first and second side gate structures have a source/drain layer, respectively;

said first and second side gate structures correspond to said at least one second gate structure; and said contact hole is disposed such as to reach said source/drain layers having sandwiched therebetween said isolation insulating film of said first and second side gate structures, and also reach said salicide layers of said first and second side gate structures.

20. The semiconductor device according to claim 19 further comprising a salicide layer on an upper part of said source/drain layer.

* * * * *

UNITED STATES PATENT AND TRADEMARK OFFICE
CERTIFICATE OF CORRECTION

| | |
|---|---|
| PATENT NO. | : 6,299,314 B1 |
| APPLICATION NO. | : 09/494785 |
| DATED | : October 9, 2001 |
| INVENTOR(S) | : Igarashi et al. |

It is certified that error appears in the above-identified patent and that said Letters Patent is hereby corrected as shown below:

In the drawings:

Sheet 16 of 16, the reference label --GE-- should be applied to the element above the "OX" element.

In the Specification:

Column 14, line 59, "GT14" should read --GT34--;

Column 25, line 33, "A-A" should read --24-24--;

Column 26, line 63, "B-B" should read --27-27--; and

Column 26, line 64, "C-C" should read --28-28--.

UNITED STATES PATENT AND TRADEMARK OFFICE
CERTIFICATE OF CORRECTION

PATENT NO. : 6,299,314 B1  
APPLICATION NO. : 09/494785  
DATED : October 9, 2001  
INVENTOR(S) : Igarashi et al.

It is certified that error appears in the above-identified patent and that said Letters Patent is hereby corrected as shown below:

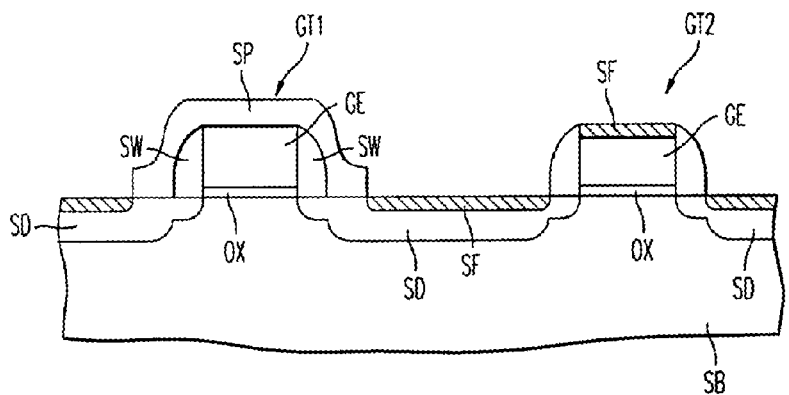

FIG. 32
BACKGROUND ART

Signed and Sealed this

Fifteenth Day of April, 2008

JON W. DUDAS
*Director of the United States Patent and Trademark Office*